US012793644B2

United States Patent
(12) United States Patent
Jang et al.

(10) Patent No.: US 12,793,644 B2
(45) Date of Patent: Nov. 10, 2026

(54) ELECTRONIC DEVICE AND METHOD FOR DRIVING ELECTRONIC DEVICE

(71) Applicant: Samsung Display Co., Ltd., Yongin-Si (KR)

(72) Inventors: Dae-Gwang Jang, Yongin-si (KR); Kuk-Hwan Ahn, Yongin-si (KR); Kyungsu Lee, Yongin-si (KR); Seungjae Lee, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 19/387,953

(22) Filed: Nov. 13, 2025

(65) Prior Publication Data

US 2026/0321205 A1 Oct. 15, 2026

(30) Foreign Application Priority Data

Apr. 14, 2025 (KR) ........................ 10-2025-0048134

(51) Int. Cl.

*G09G 3/3233* (2016.01)
*H10K 59/121* (2023.01)
*H10K 59/131* (2023.01)

(52) U.S. Cl.

CPC ....... *G09G 3/3233* (2013.01); *H10K 59/1213* (2023.02); *H10K 59/131* (2023.02); *G09G 2300/0819* (2013.01); *G09G 2300/0842* (2013.01); *G09G 2320/0233* (2013.01); *G09G 2320/10* (2013.01); *G09G 2330/021* (2013.01)

(58) Field of Classification Search

None

See application file for complete search history.

(56) References Cited

U.S. PATENT DOCUMENTS

| | | | |
|---|---|---|---|
| 11,127,345 B1 | 9/2021 | Seo et al. |
| 11,798,489 B2 | 10/2023 | Son et al. |
| 11,869,447 B2 | 1/2024 | Yoo et al. |
| 12,354,542 B2 | 7/2025 | Jang |

FOREIGN PATENT DOCUMENTS

| | | |
|---|---|---|
| CN | 117953820 A | 4/2024 |
| KR | 10-2021-0116834 A | 9/2021 |
| KR | 10-2022-0096912 A | 7/2022 |
| KR | 10-2023-0009258 A | 1/2023 |
| KR | 10-2024-0062171 A | 5/2024 |

*Primary Examiner* — Aneeta Yodichkas

(74) *Attorney, Agent, or Firm* — Innovation Counsel LLP

(57) ABSTRACT

Disclosed is an electronic device which includes a display panel that includes a plurality of pixels each including a driving transistor and a light emitting element, and in which an active area that displays an image and a peripheral area that is adjacent to the active area, a support plate that is disposed under the display panel and supports the display panel, a memory, in which a plurality of maps are stored, and a driving controller includes a controller.

20 Claims, 16 Drawing Sheets

ELECTRONIC DEVICE AND METHOD FOR DRIVING ELECTRONIC DEVICE

CROSS-REFERENCE TO RELATED APPLICATIONS

This application claims priority under 35 U.S.C. § 119 to Korean Patent Application No. 10-2025-0048134 filed on Apr. 14, 2025, in the Korean Intellectual Property Office, the disclosures of which are incorporated by reference herein in their entireties.

BACKGROUND

Embodiments of the present disclosure described herein relate to an electronic device with improved display quality and a method for driving the electronic device.

Various display devices, that are used in a multi-media device such as a television, a mobile phone, a tablet computer, a navigation system, or a game console, are being developed.

As fields in which these display devices are used are diversified, the types of display layers for displaying images displayed on display devices are also diversified.

Nowadays, a display layer includes a light emitting display layer. The light emitting display layer may include an organic light emitting display layer or a quantum dot light emitting display layer.

SUMMARY

Embodiments of the present disclosure provide an electronic device with improved display quality and a method for driving the electronic device.

According to an embodiment, an electronic device includes a display panel including a plurality of pixels each including a driving transistor and a light emitting element that is electrically connected to the driving transistor, and in which an active area for displaying an image and a peripheral area that is adjacent to the active area are defined, a support plate that is disposed under the display panel, and that supports the display panel, a memory that stores a plurality of maps, and a driving controller that drives the display panel and includes a controller, the plurality of maps include a first map in which a first current value for each position in the active area of the driving transistor in response to a data voltage is defined, a second map in which a voltage for each position in the active area applied to each of the plurality of pixels is defined, a third map in which electric power calculated based on a current and the voltage that is applied to each of the plurality of pixels is defined, and a fourth map in which heat propagation characteristics for each position of the support plate are defined, and the controller includes a first current output part that outputs the first current value corresponding to the data voltage based on the first map, a voltage output part that outputs the voltage based on the second map, a heat generation characteristics output part that calculates the electric power based on the voltage and the current, and outputs heat generation characteristics for each position in the active area based on the electric power, and a heat generation characteristics correcting part that outputs corrected heat generation characteristics based on the heat generation characteristics and the heat propagation characteristics.

The controller may further include a data voltage output part that outputs the data voltage corresponding to an input gray for each position to the first current output part.

The plurality of maps may further include a fifth map, in which a second current value for each position of the light emitting element corresponding to the first current value is stored, and the controller may further include a second current output part that outputs the second current value to the voltage output part based on the fifth map.

The first current output part may output the first current value to the second current output part, and the heat generation characteristics output part may output the heat generation characteristics corresponding to the second current value and the voltage based on the third map.

The heat propagation characteristics for each position of the support plate that is defined in the fourth map may include a thermal resistance and an ambient propagation coefficient.

The heat propagation characteristics for each position of the support plate that is defined in the fourth map may be changed depending on a shape and a type of the support plate.

The support plate may include a first area, a second area that extends from the first area in a first direction, and a third area that extends from the second area in the first direction, the second area may be folded with respect to an axis that extends in a second direction crossing the first direction, and a first value corresponding to the first area, and a second value that corresponds to the second area and is different from the first value may be defined in the fourth map.

An opening may be defined in the support plate, and a first value corresponding to an area of the support plate and a second value that corresponds to the opening and is different from the first value may be defined in the fourth map.

The electronic device may further include a voltage generator that provides the display panel with a first driving voltage and a second driving voltage having a voltage level lower than that of the first driving voltage, and the voltage may be a value that is obtained by subtracting the second driving voltage from the first driving voltage.

The plurality of maps may further include a sixth map in which the first driving voltage is stored for each position of the active area and a seventh map in which the second driving voltage for each position is stored, and the controller may further include a first voltage providing part that provides the first driving voltage to the voltage output part based on the sixth map, and a second voltage providing part that provides the second driving voltage to the voltage output part based on the seventh map.

The plurality of pixels may be connected to a plurality of data lines and a plurality of scan lines, respectively, the electronic device may further include a data driver that drives the plurality of data lines and a scan driver that drives the plurality of scan lines, and the controller may control the data driver and the scan driver.

The driving controller may receive an image signal and generate image data based on the corrected heat generation characteristics.

According to an embodiment, a method for driving an electronic device including a display panel including a plurality of pixels each including a driving transistor and a light emitting element that is electrically connected to the driving transistor, and a support plate that is disposed under the display panel includes outputting a data voltage in response to an input gray for each position of the plurality of pixels, outputting a first current value for each position of the driving transistor in response to the data voltage, outputting a voltage for each position of the plurality of pixels to a voltage output part, outputting a heat generation characteristic for each position of the plurality of pixels based on an electric power calculated based on a current for each position of light emitting elements and the voltage, and outputting corrected heat generation characteristics based on the heat generation characteristics and heat propagation characteristics for each position of the support plate.

The method may further include outputting a second current value for each position of the light emitting element in response to the first current value.

The outputting of the second current value may be disposed between the outputting of the first current value and the outputting of the voltage for each position.

The outputting of the heat generation characteristic for each position may include calculating the electric power based on the second current value and the voltage.

A first driving voltage and a second driving voltage having a voltage level lower than that of the first driving voltage may be provided to the plurality of pixels, and the outputting of the voltage may include outputting the first driving voltage for each position of the plurality of pixels, and outputting the second driving voltage for each position of the plurality of pixels.

The voltage may be a value obtained by subtracting the second driving voltage from the first driving voltage.

The outputting of the corrected heat generation characteristics may include predicting a final heat generation pattern of the display panel.

The method may further include receiving an image signal and generating image data based on the corrected heat generation characteristics.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
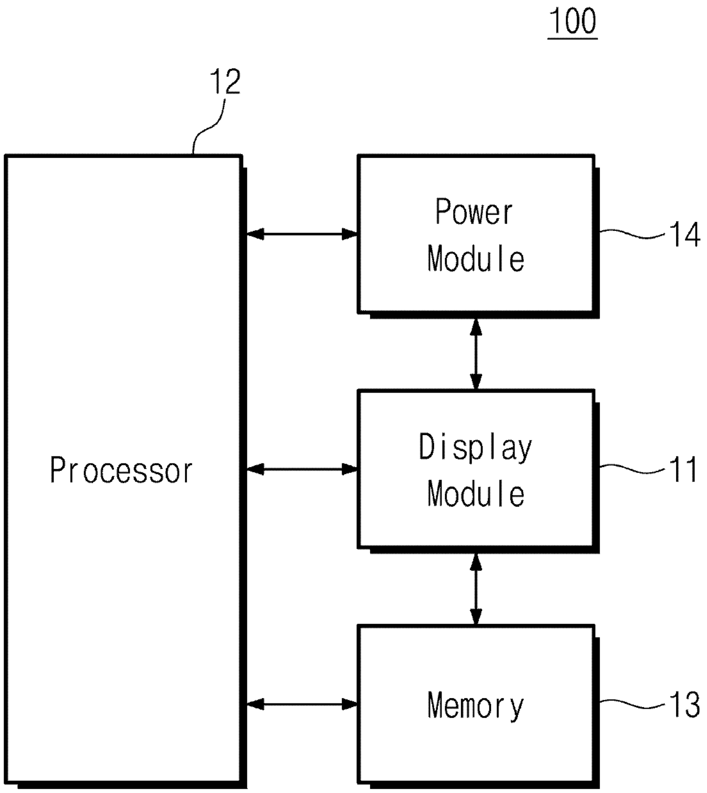
FIG. 1 is a block diagram of an electronic device according to an embodiment.

In the specification, the expression that a first component (or area, layer, part, portion, etc.) is "on", "connected with", or "coupled with" a second component means that the first component is directly on, connected with, or coupled with the second component or means that a third component is interposed therebetween.

The same reference numerals refer to the same components. Furthermore, in drawings, the thickness, ratio, and dimension of components are exaggerated for effectiveness of description of technical contents. The term "and/or" includes one or more combinations in each of which associated elements are defined.

Although the terms "first", "second", etc. may be used to describe various components, the components should not be construed as being limited by the terms. The terms are used only for the purpose of distinguishing one component, component, part, area, layer, or portion from another component, part, area, layer, or portion. For example, without departing from the scope of the present disclosure, a first component, a first part, a first area, a first layer, or a first portion may be referred to as a second component, a second part, a second area, a second layer, or a second portion, and similarly, a second component, a second part, a second area, a second layer, or a second portion may be referred to as a first component, a first part, a first area, a first layer, or a first portion. The articles "a," "an," and "the" are singular in that they have a single referent, but the use of the singular form in the specification should not preclude the presence of more than one referent.

Also, the terms "under", "below", "on", "above", and the like are used to describe the correlation of components illustrated in drawings. The terms are relative concepts, and are described with respect to directions indicated in the drawings.

It will be understood that the terms "include", "comprise", "have", and the like specify the presence of features, numbers, steps, operations, elements, or components, described in the specification, or a combination thereof, not precluding the presence or additional possibility of one or more other features, numbers, steps, operations, elements, or components or a combination thereof.

Unless otherwise defined, all terms (including technical terms and scientific terms) used in the specification have the same meaning as commonly understood by one skilled in the art to which the present disclosure belongs. Furthermore, the terms, such as the terms defined in dictionaries, which are generally used, should be construed to coincide with the context meanings of the related technologies, and are not construed as ideal or excessively formal meanings unless explicitly defined in the present disclosure.

Hereinafter, embodiments of the present disclosure will be described with reference to accompanying drawings.

FIG. 1 is a block diagram of an electronic device according to an embodiment. Referring to FIG. 1, an electronic device 100 according to an embodiment may include a display module 11, a processor 12, a memory 13, and a power module 14.

The processor 12 may include at least one of a central processing unit (CPU), an application processor (AP), a graphic processing unit (GPU), a communication processor (CP), an image signal processor (ISP), and a controller.

Data information that are necessary for an operation of the processor 12 or the display module 11 may be stored in the memory 13. When the processor 12 executes an application stored in the memory 13, an image data signal and/or an input control signal may be transmitted to the display module 11, and the display module 11 may process the provided signal and output image information through a display screen.

The power module 14 may include a power supply module such as a power adapter or a battery device and a power conversion module that converts electric power supplied by the power supply module to generate electric power that is required for an operation of the electronic device 100.

At least one of the components of the electronic device 100 described above may be included in the display device according to the above-described embodiments. Furthermore, some of the individual modules that are functionally included in one module may be included in the display device, and others may be provided separately from the display device. For example, the display device includes a display module 11, and the processor 12, the memory 13, and the power module 14 may be provided in the form of other devices in the electronic device 100 rather than the display device.

Figure 2:
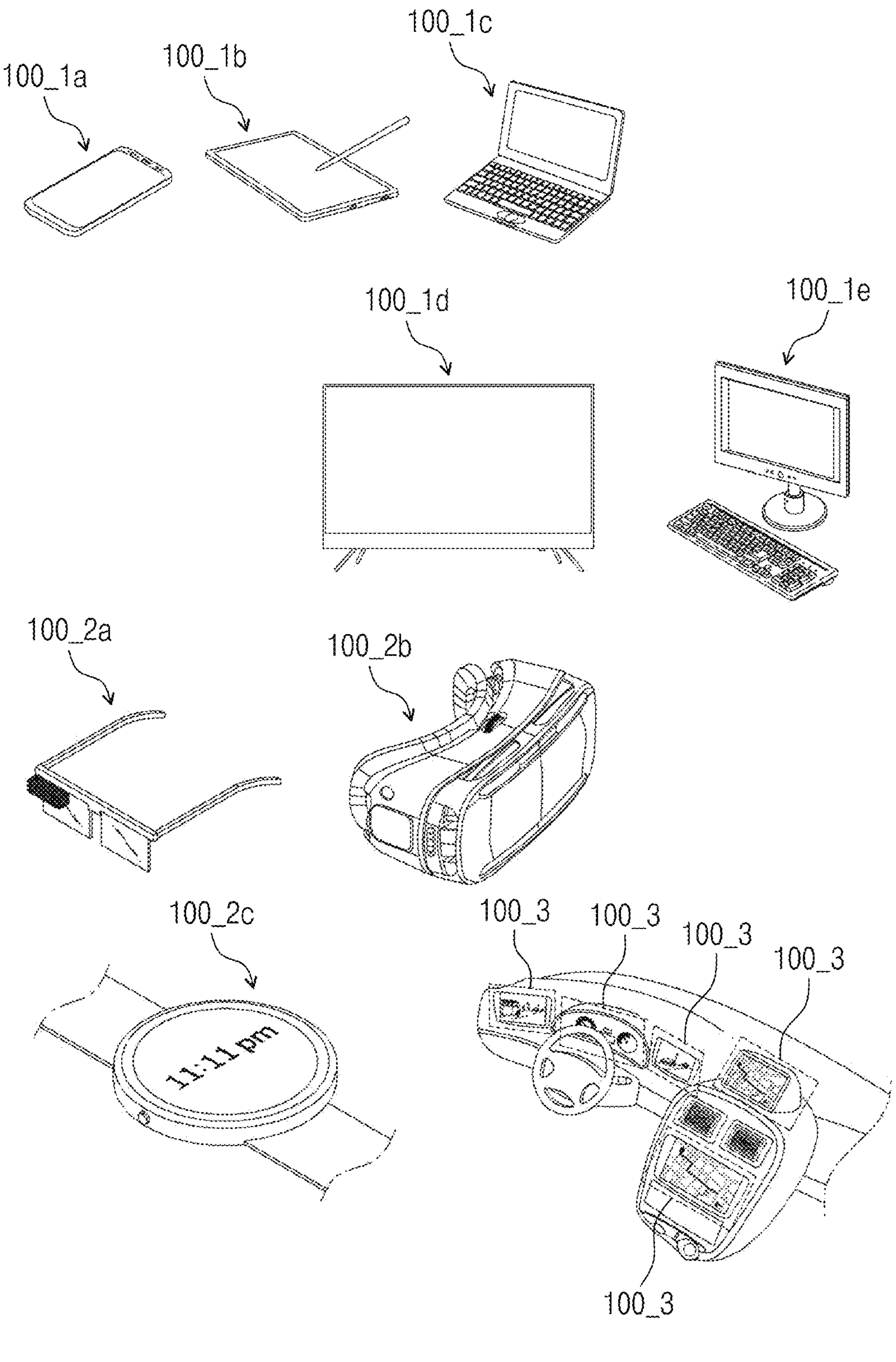
FIG. 2 is a schematic view of an electronic device according to various embodiments.

FIG. 2 illustrates schematic views of an electronic device according to various embodiments.

Referring to FIG. 2, various electronic device including the displays according to embodiments may include not only an electronic device for displaying an image, such as a smartphone 100_1*a*, a tablet PC 100_1*b*, a laptop computer 100_1*c*, a TV 100_1*d*, and a monitor 100_1*e* for a desktop computer, and but also a wearable electronic device including a display module such as smart glasses 100_2*a*, a head-mounted display 100_2*b*, and a smart watch 100_2*c*, and an electronic device 100_3 for a vehicle including a display module, such as a center information display disposed in an instrument panel for a vehicle, a center fascia, and a dash board, and a room mirror display.

Hereinafter, a display device and an electronic device including the display device according to an embodiment of the present disclosure will be described with reference to the drawings.

Figure 3A:
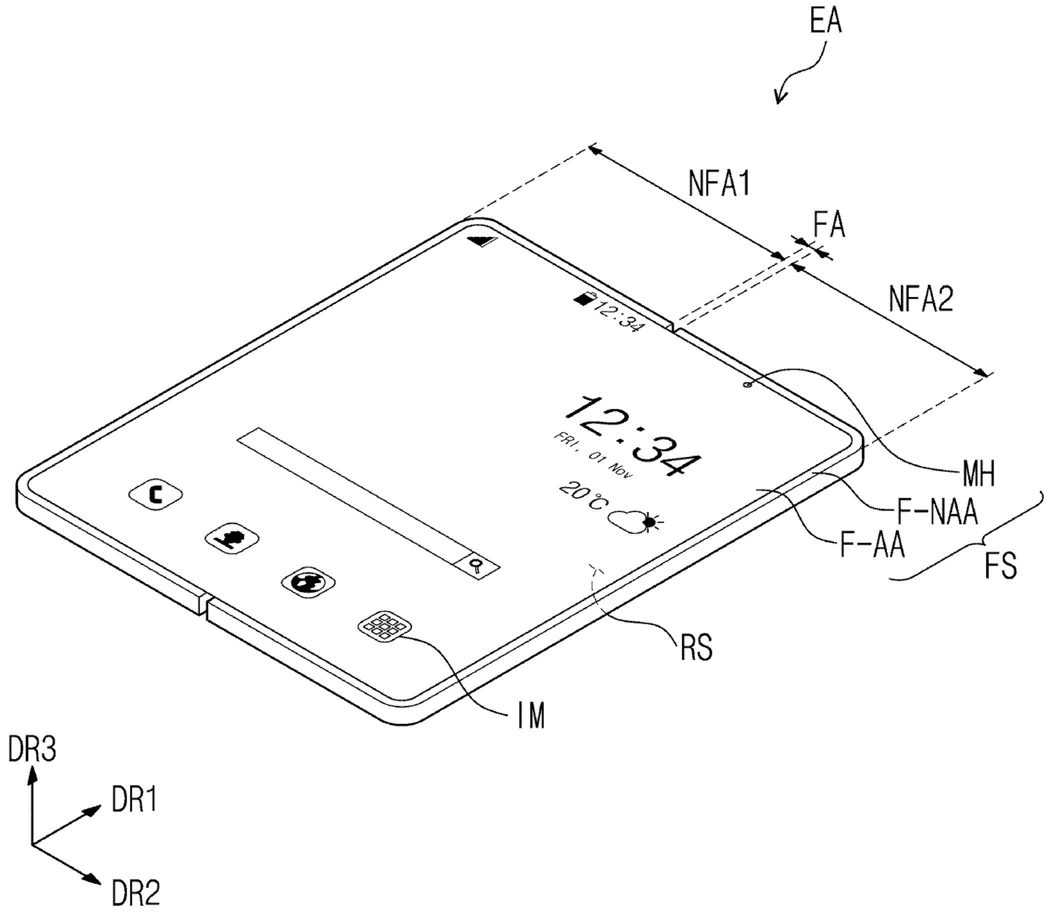
FIG. 3A is a perspective view illustrating an electronic device of an embodiment.

FIG. 3A is a perspective view of an electronic device EA in an unfolded state according to an embodiment.

Referring to FIG. 3A, an electronic device EA of an embodiment may be a device that is activated in response to an electrical signal. For example, the electronic device EA may be a smartphone, a tablet PC, a car navigation system, a game console, or a wearable device, but an embodiment is not limited thereto. In FIG. 3A and the like, the electronic device EA is illustrated as a smartphone by way of example.

The electronic device EA may include a first display surface FS that is defined by a first direction DR1 and a second direction DR2 that crosses the first direction DR1. The electronic device EA may provide an image IM to a user through the first display surface FS. The electronic device EA may display the image IM to the first display surface FS that is parallel to each of the first direction DR1 and the second direction DR2 toward a third direction DR3. The image IM may include a dynamic image and a static image.

In the specification, the first direction DR1 and the second direction DR2 may be perpendicular to each other, and the third direction DR3 may be a normal direction to a plane defined by the first direction DR1 and the second direction DR2. A thickness direction of the electronic device EA may be a direction that is parallel to the third direction DR3. The thickness direction of the electronic device EA may be denoted by the same reference symbol as that of the third direction DR3. A front surface (or an upper surface) and a rear surface (or a lower surface) may be opposite to each other in the third direction DR3, and a normal direction of each of the front surface (or the upper surface) and the rear surface (or the lower surface) may be parallel to the third direction DR3. The front surface (or the upper surface) means a surface that is adjacent to the first display surface FS, and the rear surface (or the lower surface) means a surface that is spaced apart from the first display surface FS. Furthermore, the rear surface (or the lower surface) means a surface that is close to the second display surface RS that will be described later. An upper side means a direction that becomes closer to the first display surface FS, and a lower side means a direction that becomes more distant from the first display surface FS.

A cross section means a surface that is parallel to the third direction DR3, and a plane means a surface that is perpendicular to the third direction DR3. A plane means a surface that is parallel to a plane defined by the first direction DR1 and the second direction DR2.

Directions indicated by the first to third directions DR1, DR2, and DR3 described in the specification are relative concepts, and may be altered to different directions. Besides, the directions indicated by the first to third directions DR1, DR2, and DR3 may be described as first to third directions, and the same reference numerals may be used.

The electronic device EA may sense an external input applied from the outside. The external input may include various types of inputs that are provided from the outside of the electronic device EA. For example, as well as a contact by a part of a body such as a user's hand, the external input may include an external input (e.g., hovering) applied when the user's hand approaches the electronic device EA or is adjacent to the electronic device EA within a predetermined distance. In addition, the external input may have various types such as force, pressure, temperature, light, and the like.

The electronic device EA may include a first display surface FS and a second display surface RS. The first display surface FS may include a first active area F-AA, a first peripheral area F-NAA, and a sub-area MH. The second display surface RS may be defined as a surface that faces at least a portion of the first display surface FS. That is, the second display surface RS may be defined as a portion of a rear surface of the electronic device EA.

The first active area F-AA may be an area that is activated in response to an electrical signal. The first active area F-AA may be an area, in which the image IM is displayed, and various forms of external inputs may be detected.

The first peripheral area F-NAA may be adjacent to the first active area F-AA. A light transmittance of the first peripheral area F-NAA may be lower than a light transmittance of the first active area F-AA. The first peripheral area F-NAA may have a specific color. The first peripheral area F-NAA may surround the first active area F-AA. Accordingly, a shape of the first active area F-AA may be substantially defined by the first peripheral area F-NAA. However, the first peripheral area F-NAA may be disposed adjacent to only one side of the first active area F-AA or may be omitted.

The sub-area MH may sense an external subject received through the display surfaces FS and RS or provide an audio signal, such as a voice, to the outside through the display surfaces FS and RS. An optical signal, such as visible light or infrared light, may travel through the sub-area MH.

Various electronic modules ELM (see FIG. 4) may be disposed to correspond to the sub-area MH. For example, the electronic module ELM (see FIG. 4) may include at least one of a camera, a speaker, a light detection sensor, and a heat detection sensor. The electronic device EA may include an electronic module ELM (see FIG. 4) that captures an external image through visible rays that passes through the sub-area MH or determines an accessibility of an external object through infrared rays. The electronic module ELM (see FIG. 4) may include a plurality of components, and the present disclosure is not limited to any one embodiment.

The sub-area MH may be disposed in the first active area F-AA. However, this is merely exemplary, and the embodiment is not limited thereto. For example, the sub-area MH may be surrounded by the first peripheral area F-NAA, or may be surrounded by the first active area F-AA and the first peripheral area F-NAA. Although one sub-area MH is illustrated in FIG. 3A, a plurality of sub-areas MH may be provided in the first active area F-AA to be surrounded by the first peripheral area F-NAA or to be surrounded by the first active area F-AA and the first peripheral area F-NAA.

The electronic device EA of an embodiment may include at least one folding area FA and a plurality of non-folding areas NFA1 and NFA2 that extend from the folding area FA. For example, a first non-folding area NFA1, a folding area FA, and a second non-folding area NFA2 may be defined along the second direction DR2. The electronic device EA of an embodiment may include a first non-folding area NFA1 and a second non-folding area NFA2 that are spaced apart from each other in the second direction DR2 with the folding area FA interposed therebetween. For example, the first non-folding area NFA1 may be disposed on one side of the folding area FA along the second direction DR2, and the second non-folding area NFA2 may be disposed on an opposite side of the folding area FA along the second direction DR2.

FIG. 3A and the like illustrate an embodiment of the electronic device EA including one folding area FA, and the embodiment is not limited thereto, and a plurality of folding areas may be defined in the electronic device EA. For example, the electronic device according to an embodiment may include two or more folding areas, and may also include three or more non-folding areas that are disposed with the folding areas interposed therebetween.

Figure 3B:
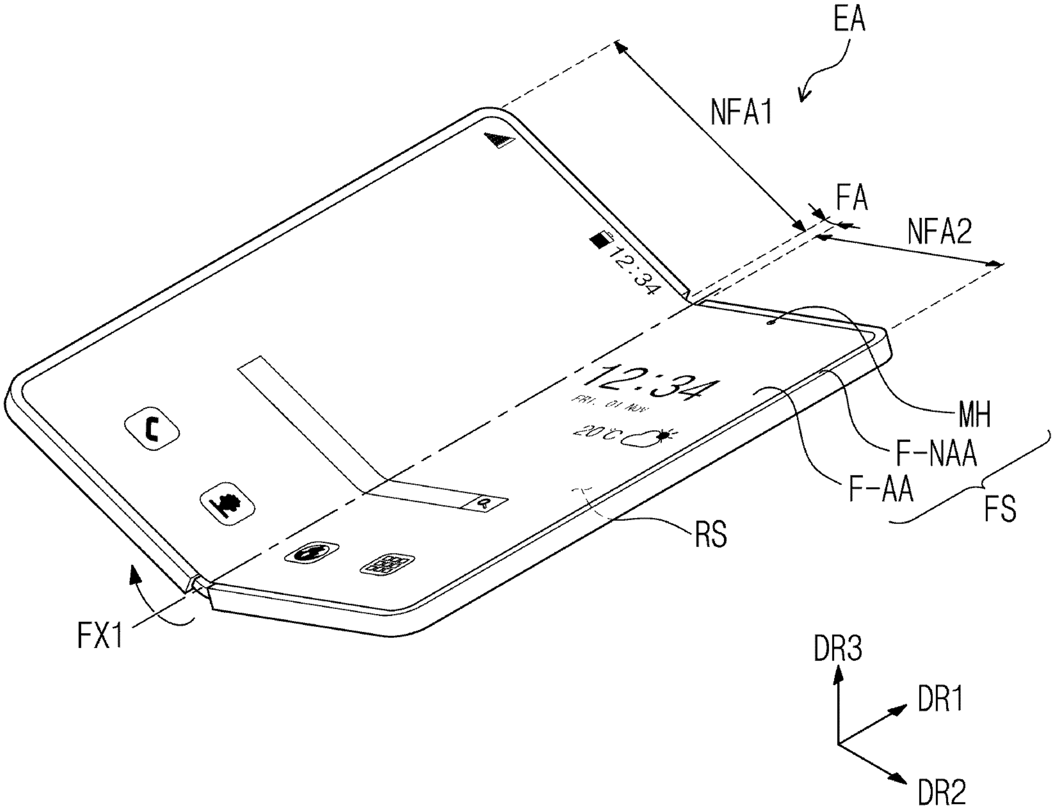
FIG. 3B is a perspective view illustrating an electronic device of an embodiment.

FIG. 3B is a perspective view illustrating a folding operation of the electronic device EA according to an embodiment. Referring to FIG. 3B, the electronic device EA according to an embodiment may be folded with respect to a first folding axis FX1 that extends in the first direction DR1. In a folded state, the folding area FA of the electronic device EA may be folded to have a specific radius of curvature. The electronic device EA may be folded with respect to the first folding axis FX1 so that the first non-folding area NFA1 and the second non-folding area NFA2 face each other, and may be transformed into an in-folding state such that a first display surface FS is not exposed to the outside.

FIGS. 3A and 3B illustrate, by way of example, that folding is made with respect to one folding axis FX1, but the number of folding axes and thus the number of non-folding areas in the electronic device according to an embodiment are not limited thereto. For example, the electronic device may be folded with respect to a plurality of folding axes so that portions of the first display surface FS and the second display surface RS face each other. Furthermore, it is illustrated that the first folding axis FX1 is parallel to a long side of the electronic device EA, but the embodiment is not limited thereto, and the first folding axis FX1 may be parallel to a short side of the electronic device EA.

In the electronic device EA, the first non-folding area NFA1 and the second non-folding area NFA2 may be defined as portions having the display surfaces FS and RS that are parallel to a plane defined by the first direction DR1 and the second direction DR2 in a folded state, as illustrated in FIG. 3A, and the like, and the folding area FA may be defined as an area between the first non-folding area NFA1 and the second non-folding area NFA2. The folding area FA may include a curved part that is bent to have a specific radius of curvature in the folded state.

Figure 4:
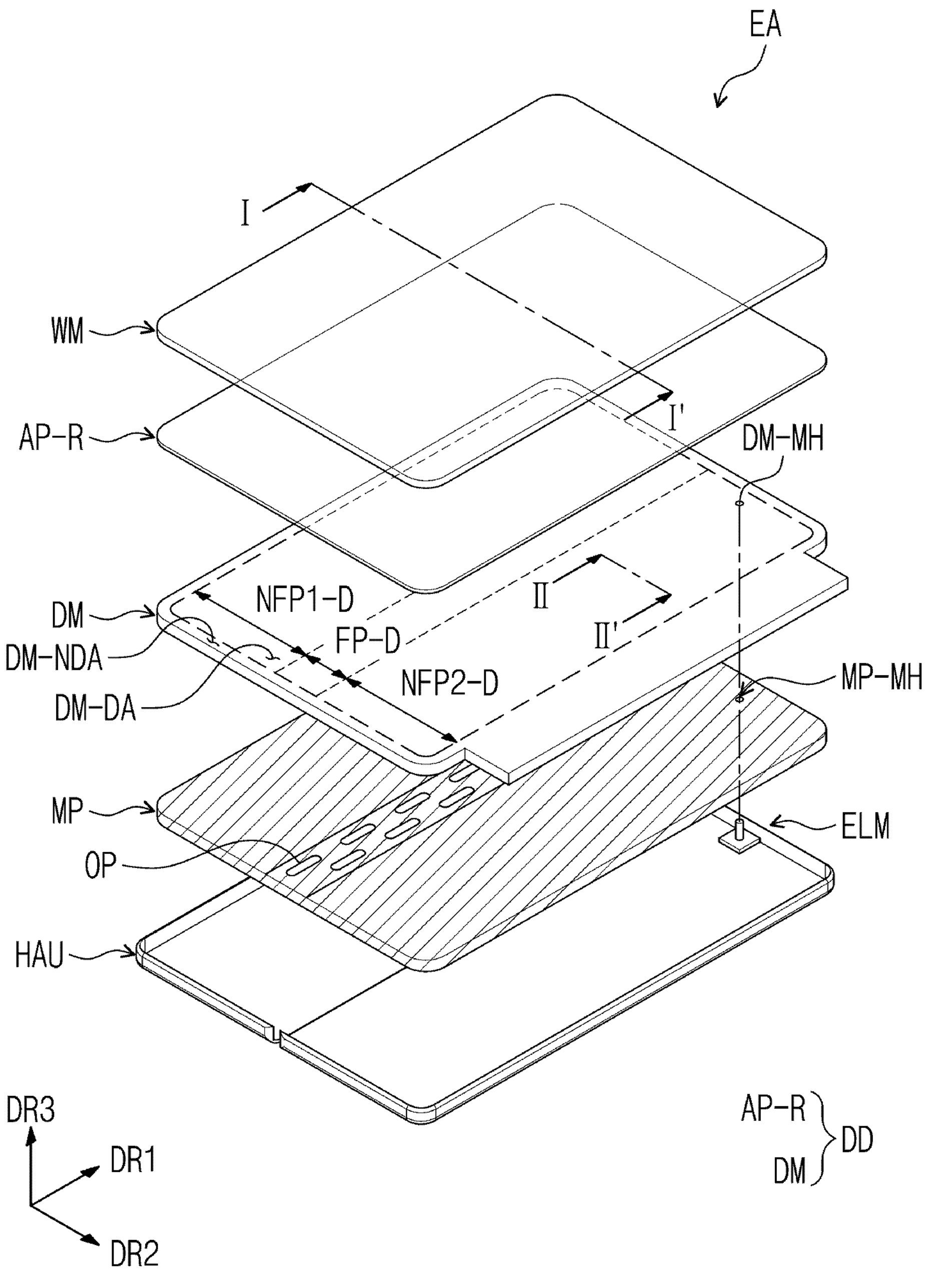
FIG. 4 is an exploded perspective view illustrating an electronic device of an embodiment.

FIG. 4 is an exploded perspective view illustrating the electronic device EA according to an embodiment. Referring to FIG. 4, the electronic device EA may include an electronic module ELM, a display device DD, and a support plate MP. Furthermore, the electronic device EA may further include a housing HAU. In an embodiment, the display device DD may include a display module DM and a window WM that is disposed on the display module DM. The display device DD may be one, in which a module area DM-MH is defined, and the electronic module ELM may be disposed to correspond to the module area DM-MH.

The image IM (FIG. 1A) generated in the display module DM may be provided to a user after passing through the window WM.

The window WM may include an optically transparent insulating material. For example, the window WM may include glass or plastic. The window WM may include a multi-layer structure or a single layer structure. For example, the window WM may include a plurality of plastic films bonded to each other by an adhesive or may have a glass substrate and a plastic film bonded to each other by an adhesive.

The window WM may be folded along at least one folding axis FX1 (FIG. 3B).

The display device DD may further include an upper adhesive layer AP-R. The upper adhesive layer AP-R may be disposed between the display module DM and the window WM. The display module DM and the window WM may be coupled to each other through the upper adhesive layer AP-R. The upper adhesive layer AP-R may include a pressure sensitive adhesive PSA, an optically clear adhesive film OCA, or an optically clear adhesive resin layer OCR. However, the embodiment is not limited thereto. Unlike the illustration, the upper adhesive layer AP-R may be omitted.

The display module DM may display an image in response to an electrical signal and may transmit/receive information on an external input. A display area DM-DA and a non-display area DM-NDA may be defined in the display module DM. Furthermore, a module area DM-MH may be defined in the display module DM.

The display area DM-DA may be defined as an area that emits an image provided by the display module DM. The display area DM-DA of the display module DM may correspond to at least a portion of the first active area F-AA (FIG. 1A).

A driving circuit or a driving wiring for driving the display area DM-DA may be disposed in the non-display area DM-NDA. The non-display area DM-NDA may be adjacent to the display area DM-DA. For example, the non-display area DM-NDA may surround the display area DM-DA. However, the non-display area DM-NDA may be defined in various shapes and is not limited to any one embodiment.

The module area DM-MH may correspond to the sub-area MH illustrated in FIG. 3A. An optical signal may travel to the module area DM-MH. The module area DM-MH may be located in the display area DM-DA. However, a location of the module area DM-MH is not limited to any one embodiment.

The electronic module ELM may be disposed to correspond to the module area DM-MH. The electronic module ELM may be an electronic component that outputs or receives an optical signal. For example, the electronic module ELM may include a camera module and/or a proximity sensor. The camera module may capture an external image through the module area DM-MH. However, the embodiment is not limited thereto, and the electronic module ELM may further include a built-in module and/or an external module. The built-in module may include a sensor module, an antenna module, and an audio output module. The external module may include a light module and a communication module.

The display module DM may include a folding display part FP-D and non-folding display parts NFP1-D and NFP2-D. The folding display part FP-D may be a part corresponding to the folding area FA (FIG. 1A), and the non-folding display parts NFP1-D and NFP2-D may be parts corresponding to the non-folding areas NFA1 and NFA2, respectively (FIG. 3A).

A support plate MP may be disposed under a display module DM. The support plate MP may support the display module DM. A plurality of openings OP may be defined in the folding area FA of the support plate MP. A module opening MP-MH may be defined in the support plate MP to correspond to the electronic module ELM. For example, the electronic module ELM may be disposed in the module opening MP-MH. However, this is exemplary and the disposition relationship of the electronic module ELM according to an embodiment of the present disclosure is not limited thereto.

The support plate MP may include a metal material. For example, the support plate MP may be formed of stainless steel, aluminum, or an alloy thereof.

The housing HAU may include a material having a relatively high rigidity. For example, the housing HAU may include a plurality of frames and/or plates formed of glass, plastic, or metal. The housing HAU may provide a specific accommodation space. The display module DM may be accommodated in the accommodation space to be protected from external impact.

Figure 5:
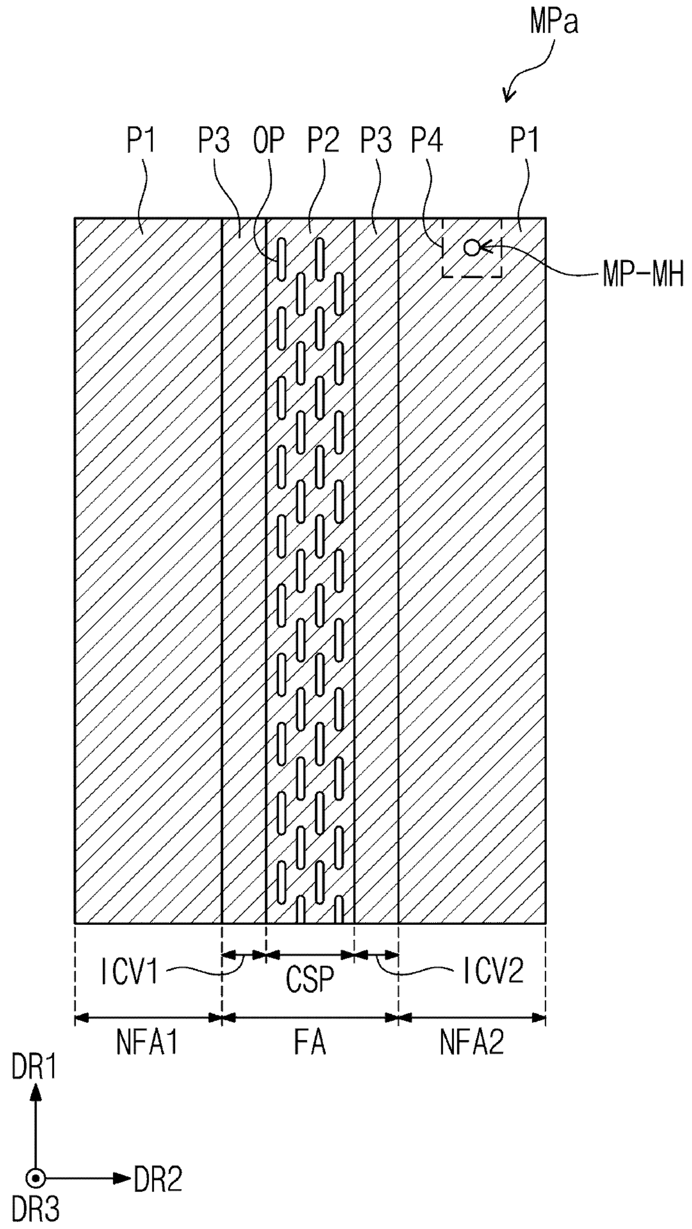
FIG. 5 is a plan view of a support plate according to an embodiment of the present disclosure.

FIG. 5 is a plan view of a support plate according to an embodiment of the present disclosure.

Referring to FIG. 3B and FIG. 5, the folding area FA may include a first inverse curvature part ICV1, a second inverse curvature part ICV2, and a curved part CSP. The first inverse curvature part ICV1 may be disposed between the first non-folding area NFA1 and the curved part CSP. The first inverse curvature part ICV1 may be disposed between the first non-folding area NFA1 and the curved part CSP. The second inverse curvature part ICV2 may be disposed between the second non-folding area NFA2 and the curved part CSP. The curved part CSP may be disposed between the first inverse curvature part ICV1 and the second inverse curvature part ICV2.

When the folding area FA is folded, the curved part CSP may be bent to have a specific radius of curvature. The first inverse curvature part ICV1 and the second inverse curvature part ICV2 may be bent opposite to the curved part CSP, and may be bent symmetrically to each other. This will be described later.

The support plate MP may include a first area P1, a second area P2 that extends in the second direction DR2 from the first area P1, a third area P3 that is disposed between the first area P1 and the second area P2, and a fourth area P4 that is adjacent to a portion of the third area P3. The second area P2 may be folded with respect to an axis that extends in the first direction DR1.

A plurality of first areas P1 may be provided. The plurality of first areas P1 may be spaced apart from each other in the second direction DR2 with the second area P2 interposed therebetween.

A plurality of third areas P3 may be provided. The plurality of third areas P3 may be spaced apart from each other in the second direction DR2 with the second area P2 interposed therebetween.

In a plan view, the plurality of first areas P1 may correspond to the first non-folding area NFA1 and the second non-folding area NFA2, respectively. The second area P2 may correspond to the curved part CSP. The plurality of third areas P3 may correspond to the first inverse curvature part ICV1 and the second inverse curvature part ICV2, respectively. The fourth area P4 may be defined as an area that is adjacent to the module opening MP-MH. The fourth area P4 may be an area including the module opening MP-MH, from which a portion of the support plate MP is removed.

Each of the plurality of first areas P1 may have first heat dissipation characteristics. The first heat dissipation characteristics may be defined by the components of the electronic device EA which overlap the plurality of first areas P1.

The second area P2 may have second heat dissipation characteristics. The second heat dissipation characteristics may be different from the first heat dissipation characteristics due to a curved part CSP that is bent to have a specific curvature.

The plurality of third areas P3 may have third heat dissipation characteristics. The third heat dissipation characteristics may be different from the first heat dissipation characteristics and the second heat dissipation characteristics due to a first inverse curvature part ICV1 and a second inverse curvature part ICV2 that are curved opposite to the curved part CSP.

The fourth area P4 may have fourth heat dissipation characteristics. The fourth heat dissipation characteristics may be different from the first to third heat dissipation characteristics due to an electronic module ELM (see FIG. 4) disposed under the support plate MP.

For example, because the second area P2 has to be structurally bent, a different heat dissipation structure from the first areas P1 is applied. Accordingly, depending on the design of the product, two or more areas with different heat dissipation characteristics may exist on the rear surface of the display panel DP.

Figure 6:
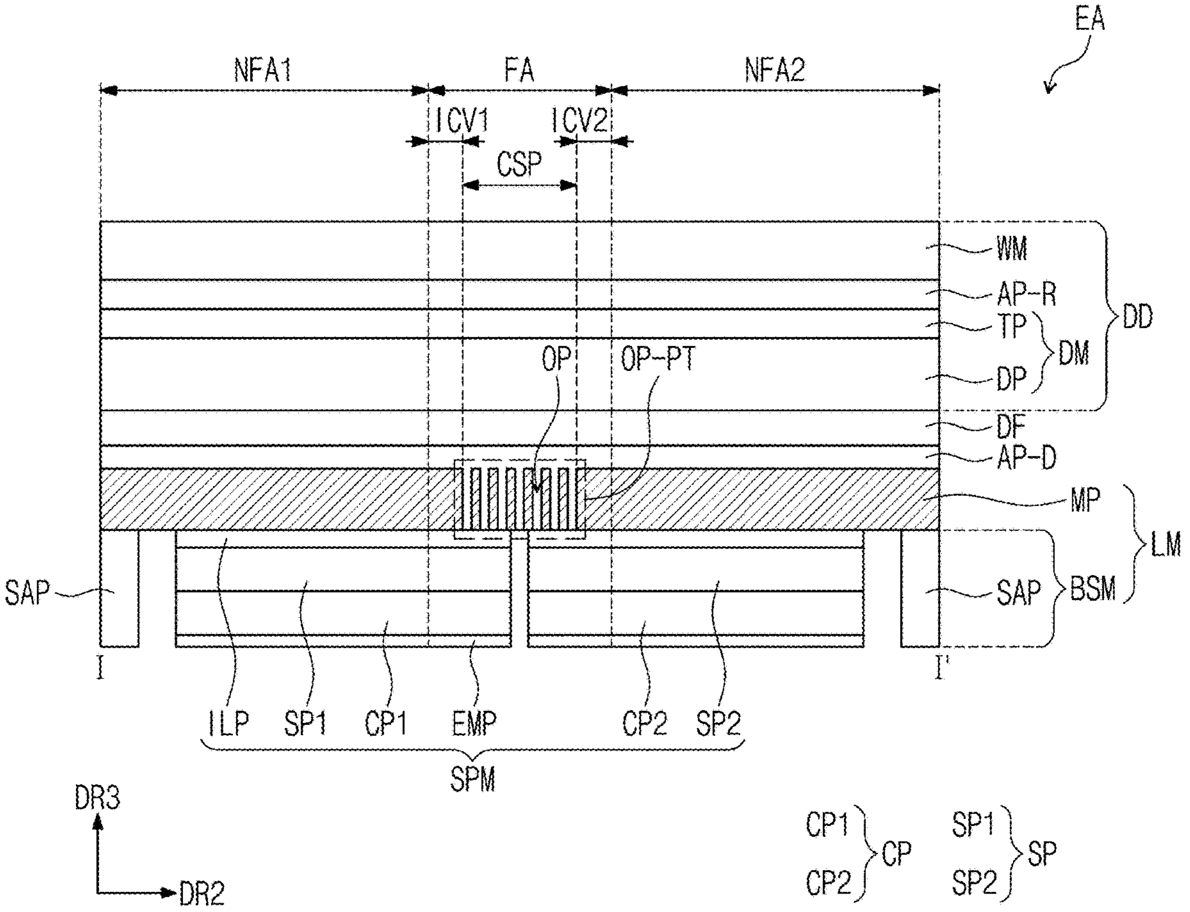
FIG. 6 is a cross-sectional view illustrating a portion corresponding to line I-I' of FIG. 4.

FIG. 6 is a cross-sectional view illustrating a portion corresponding to line I-I illustrated in FIG. 4. FIG. 6 may be a cross-sectional view illustrating the electronic device EA of an embodiment. In FIG. 6, the housing HAU (see FIG. 4) is omitted for convenience of description.

Referring to FIG. 6, the electronic device EA may further include a lower module LM, a lower adhesive layer AP-D, and a lower protective film DF. The lower module LM, the lower adhesive layer AP-D, and the lower protective film DF may be located between the display device DD and the housing HAU (see FIG. 4).

The lower module LM may be disposed under the display module DM. The lower module LM may include a support plate MP and a lower support member BSM. The configuration of the lower module LM illustrated in FIG. 6 is merely an example, and the combination of configurations included in the lower module LM in the electronic device EA of an embodiment may vary depending on the size of the electronic device EA, the shape of the electronic device EA, or the operation characteristics of the electronic device EA.

A plurality of openings OP may be defined in the support plate MP. The support plate MP may include an opening pattern OP-PT in which the plurality of openings OP are defined. The opening pattern OP-PT may be formed in the folding area FA.

The lower support member BSM may include a support member SPM and a filling part SAP. In a plan view, the support member SPM may overlap most of an area of the display module DM. The filling part SAP may be disposed on the outside of the support member SPM and overlaps an outskirt of the display module DM.

The support member SPM may include at least one of a support layer SP, a cushion layer CP, a shield layer EMP, and an inter-layer bonding layer ILP. The configuration of the support member SPM illustrated in FIG. 6 is merely an example, and the embodiment is not limited thereto. For example, some of the support layer SP, the cushion layer CP, the shield layer EMP, and the inter-layer bonding layer ILP may be omitted, or the lamination order thereof may be modified to a different order from that illustrated in FIG. 6, or an additional configuration other than the illustrated configuration may be further included in the support member SPM.

The support layer SP may include a metal material or a polymer material. The support layer SP may be disposed under the support plate MP. For example, the support layer SP may be a thin film metal substrate. The support layer SP may include a first sub-support layer SP1 and a second sub-support layer SP2 that are spaced apart from each other in the second direction DR2. The first sub-support layer SP1 and the second sub-support layer SP2 may be spaced apart from each other in an area corresponding to a folding axis FX1 (see FIG. 3B). The support layer SP may be provided as the first sub-support layer SP1 and the second sub-support layer SP2 spaced apart from each other in the folding area FA to improve the folding characteristics of the electronic device EA.

The cushion layer CP may be disposed on a lower side of the support layer SP. The cushion layer CP may prevent the support plate MP from being pressed down and plastic-deformed due to external impact and force. The cushion layer CP may improve the impact resistance of the electronic device EA. The cushion layer CP may include an elastomer such as a sponge, a foam, or a urethane resin. Furthermore, the cushion layer CP may be formed to include at least one of an acrylic polymer, a urethane polymer, a silicone polymer, and an imide polymer. However, this is exemplary, and the embodiment are not limited thereto.

The cushion layer CP may include a first sub-cushion layer CP1 and a second sub-cushion layer CP2 that are spaced apart from each other in the second direction DR2. The first sub-cushion layer CP1 and the second sub-cushion layer CP2 may be spaced apart from each other at a portion corresponding to the folding axis FX1 (see FIG. 3B). The cushion layer CP may be provided as the first sub-cushion layer CP1 and the second sub-cushion layer CP2 spaced apart from each other in the folding area FA to improve the folding characteristics of the electronic device EA.

The shield layer EMP may be an electromagnetic shield layer or a heat dissipation layer. Furthermore, the shield layer EMP may function as a bonding layer.

The inter-layer bonding layer ILP may bond the components of the support plate MP and the support member SPM. The inter-layer bonding layer ILP may be provided in the form of a bonding resin layer or an adhesive tape. In FIG. 6, the inter-layer bonding layer ILP is illustrated as being provided as two components spaced apart from each other in an area corresponding to the folding axis FX1 (see FIG. 3B), but the embodiment is not limited thereto. Unlike the illustration, the inter-layer bonding layer ILP may be provided as one layer that is not spaced apart in an area corresponding to the folding axis FX1 (see FIG. 3B).

The filling part SAP may be disposed at the outskirt of the support layer SP and the cushion layer CP. The filling part SAP may be disposed between the support plate MP and the housing HAU (see FIG. 4). The filling part SAP may fill the space between the support plate MP and the housing HAU (see FIG. 4), and may fix the support plate MP to the housing HAU.

The lower protective film DF may be disposed between the display module DM and the support plate MP. The lower protective film DF may be disposed under the display module DM to protect the rear surface of the display module DM. The lower protective film DF may overlap the display module DM on the rear side. The lower protective film DF may include a polymer material. For example, the lower protective film DF may include a polyimide film or a polyethylene terephthalate film. However, this is merely an example and the lower protective film DF is not limited thereto.

A lower adhesive layer AP-D may be disposed between the support plate MP and the lower protective film DF. The support plate MP and the lower protective film DF may be coupled to each other through the lower adhesive layer AP-D. The lower adhesive layer AP-D may include a pressure sensitive adhesive PSA, an optically clear adhesive film OCA, or an optically clear adhesive resin layer OCR. However, this is merely an example, and the embodiment is not limited thereto. Unlike the illustration, the lower adhesive layer AP-D may be omitted.

The display module DM may include a display panel DP and an input sensing part TP that is disposed on the display panel DP. The display panel DP may generate an image. The display panel DP according to an embodiment may be folded with respect to the folding axis FX1 (see FIG. 3B).

The input sensing part TP may sense an external input, change it into a specific input signal, and provide the input signal to the display panel DP. For example, the input sensing part TP may be a touch sensing part that senses touch. The input sensing part TP may recognize a direct touch of a user, an indirect touch of a user, a direct touch of an object, or an indirect touch of an object.

The input sensing part TP may sense at least one of a position of a touch applied from the outside and an intensity (pressure) of the touch. In an embodiment, the input sensing part TP may have various structures or include various materials, and the present disclosure is not limited to any one embodiment. For example, the input sensing part TP may sense an external input in a capacitive manner. The display panel DP may receive an input signal from the input sensing part TP, and may generate an image corresponding to the input signal.

During a folding operation of the electronic device EA, the curved part CSP may be bent to have a specific radius of curvature with respect to the folding axis FX1 (see FIG. 3B). The first inverse curvature part ICV1 may be bent opposite to the curved part CSP. The second inverse curvature part ICV2 may be bent opposite to the curved part CSP. The first inverse curvature part ICV1 and the second inverse curvature part ICV2 may be bent to be symmetrical to each other.

Due to this shape, the support plate MP may be folded into a dumbbell shape. Accordingly, a distance between the first non-folding area NFA1 and the second non-folding area NFA2 may be smaller than a diameter of a circle having the above-mentioned radius of curvature.

Figure 7:
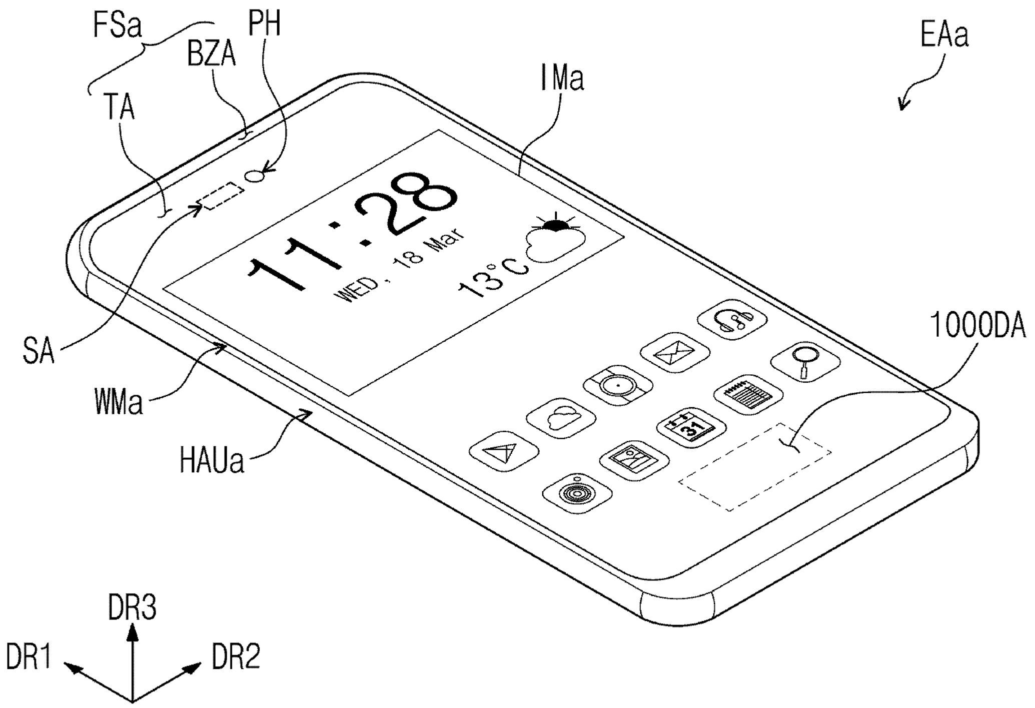
FIG. 7 is a perspective view of an electronic device according to an embodiment of the present disclosure.
Figure 8:
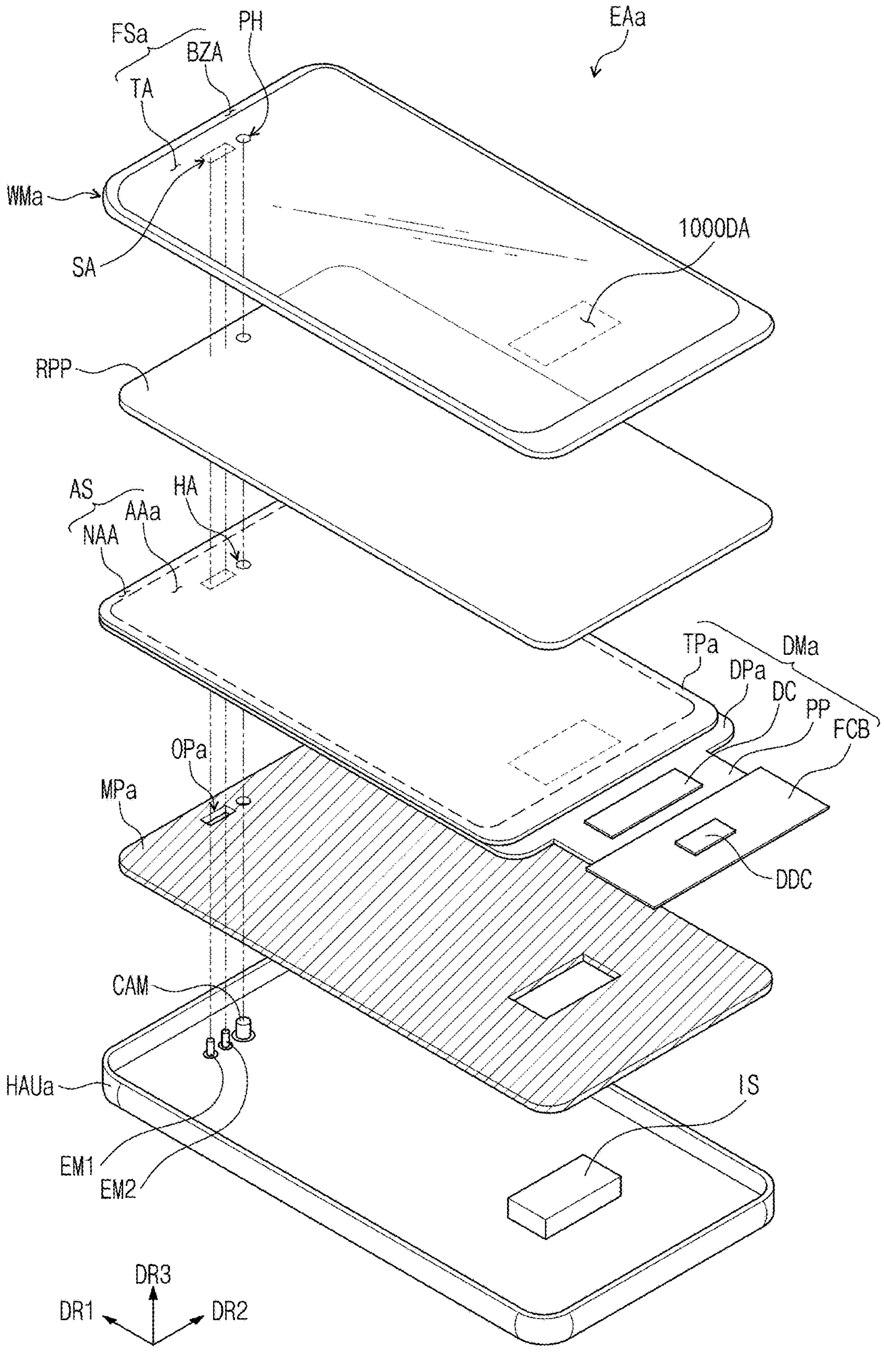
FIG. 8 is an exploded perspective view of an electronic device according to an embodiment of the present disclosure.

FIG. 7 is a perspective view of the electronic device according to an embodiment of the present disclosure, and FIG. 8 is an exploded perspective view of the electronic device according to an embodiment of the present disclosure.

Referring to FIG. 7, the electronic device EAa may be a device that is activated by an electrical signal. In FIG. 7, the electronic device EAa is illustrated as a smartphone.

The electronic device EAa may display an image IMa on a display surface FSa, which is parallel to each of the first direction DR1 and the second direction DR2, in a third direction DR3. The image IMa may include a still image as well as a moving image. In FIG. 7, a clock and icons are illustrated as an example of the image IMa. The display surface FSa, on which the image IMa is displayed, may correspond to a front surface of the electronic device EAa.

Referring to FIG. 8, the electronic device EAa may include a window WMa, a reflection preventing panel RPP, a display module DMa, a camera module CAM, a first electronic module EM1, a second electronic module EM2, an input sensor IS, and a housing HAUa. In the embodiment, the window WMa and the housing HAUa may be combined to form an exterior of the electronic device EAa.

The display surface FSa of the window WMa defines the front surface of the display device DD, as described above. The display surface FSa may include a transmission area TA and a bezel area BZA.

The transmission area TA may be an optically transmission area. For example, the transmission area TA may be an area having a visible ray transmittance of about 90% or more. A first sensing area PH, a second sensing area SA, and a third sensing area 1000DA may be defined in the transmission area TA.

A camera module CAM may be disposed in an area that overlaps the first sensing area PH.

A first electronic module EM1 and a second electronic module EM2 may be disposed in an area that overlaps the second sensing area SA.

An input sensor IS may be disposed in an area that overlaps the third sensing area 1000DA.

Light transmittance of the bezel area BZA may be relatively low in comparison to the transmission area TA. The bezel area BZA may have a specific color. The bezel area BZA defines a shape of the transmission area TA. The bezel area BZA is adjacent to the transmission area TA, and may surround the transmission area TA. In the window WMa according to an embodiment of the present disclosure, the bezel area BZA may be omitted.

The reflection preventing panel RPP may be disposed under the window WMa. The reflection preventing panel RPP reduces a reflectance of external light incident from an upper surface of the window WMa. In an embodiment of the present disclosure, the reflection preventing panel RPP may be omitted or may be embedded in the display module DM.

The display module DMa may display an image IMa, and may sense an external input. The display module DMa includes a front surface AS including an active area AAa and a peripheral area NAA. The active area AAa may be an area that is activated in response to an electrical signal.

In the embodiment, the active area AAa is an area in which an image IMa is displayed and may also be an area in which an external input is sensed. The transmission area TA overlaps at least the active area AAa. For example, the transmission area TA overlaps the entire surface or at least a portion of the active area AAa. Accordingly, the user may view the image IMa through the transmission area TA or provide an external input. However, this is illustrated by way of example, and an area in which the image IMa is displayed and an area in which the external input is sensed may be separated from each other in the active area AAa, and the present disclosure is not limited to any one embodiment.

A sensing hole HA may be defined in the active area AAa. The sensing hole HA may be disposed to correspond to the first sensing area PH. The camera module CAM may receive a signal from the outside through the sensing hole HA.

An area corresponding to the second sensing area SA of the active area AAa may be a portion of the active area AAa. Accordingly, the electronic device EAa may display an image IMa through the second sensing area SA.

The peripheral area NAA may be an area covered by a bezel area BZA. The peripheral area NAA is adjacent to the active area AAa. The peripheral area NAA may surround the active area AAa. A driving circuit or driving wiring for driving the active area AAa may be disposed in the peripheral area NAA.

In the embodiment, the display module DM is assembled in a flat state, in which the active area AAa and the peripheral area NAA face the window WMa. However, this is illustrated by way of example, and a portion of the peripheral area NAA of the display module DMa may be curved. In this case, a part of the peripheral area NAA may face the rear surface of the display device DD, so that the bezel area BZA on the front surface of the display device DD may be decreased. Alternatively, the display module DMa may be assembled in a state in which a portion of the active area AAa is also curved.

The display module DMa may include a display panel DPa, an input sensing part TPa, and a driving circuit DC.

The display panel DPa may generate an image IMa. The image IMa generated by the display panel DPa is visually recognized by a user through the transmission area TA.

The input sensing part TPa senses external input applied from the outside. As described above, the input sensing part TPa may sense the external input provided to the window WMa.

The display panel DPa may include a pad area PP. A plurality of signal pads may be disposed in the pad area PP of the display panel DPa. The display panel DPa may be electrically connected to a printed circuit board FCB through the signal pads. In an embodiment, a driving circuit DC that generates signals that are necessary for the operation of the display panel DPa may be mounted in the pad area PP.

A support plate MPa may be disposed under a display module DMa. The support plate MPa may support the display module DMa. A plurality of openings OPa may be defined in the support plate MPa. The plurality of openings OPa may be defined to correspond to the first sensing area PH, the second sensing area SA, and the third sensing area 1000DA, respectively. The support plate MPa may include a metal material. For example, the support plate MPa may be formed of stainless steel, aluminum, or an alloy thereof.

The printed circuit board FCB may include various driving circuits that drive the display panel DP and the input sensing part TPa, a connector for power supply, or the like. In an embodiment, the printed circuit board FCB may include a panel driver DDC for driving the display panel DP. The panel driver DDC may be formed as an integrated circuit to be mounted on the printed circuit board FCB.

The camera module CAM, the first electronic module EM1, and the second electronic module EM2 may be disposed under the display panel DP.

An input sensor IS may be disposed under the display panel DP. The input sensor IS may sense user's biometric authentication information that is applied from the outside. For example, the biometric authentication information may be a fingerprint. The input sensor IS may sense a surface of a touch target. The surface may include surface uniformity or surface curvature shapes. For example, the surface may include user's fingerprint information. The input sensor IS may be referred to as a fingerprint sensing panel, a fingerprint sensing element, a fingerprint sensing module, or a fingerprint sensing layer.

The housing HAUa is coupled to the window WMa. The housing HAUa may be coupled to the window WMa to provide a space in which a reflection preventing panel RPP, a display module DM, a camera module CAM, a first electronic module EM1, and a second electronic module EM2 may be accommodated.

The housing HAUa may include a material having a relatively high rigidity. For example, the housing HAUa may include a plurality of frames and/or plates including glass, plastic, or metal, or a combination thereof. The housing HAUa may stably protect components of the display device DD which are accommodated in the interior space from an external impact.

Figure 9:
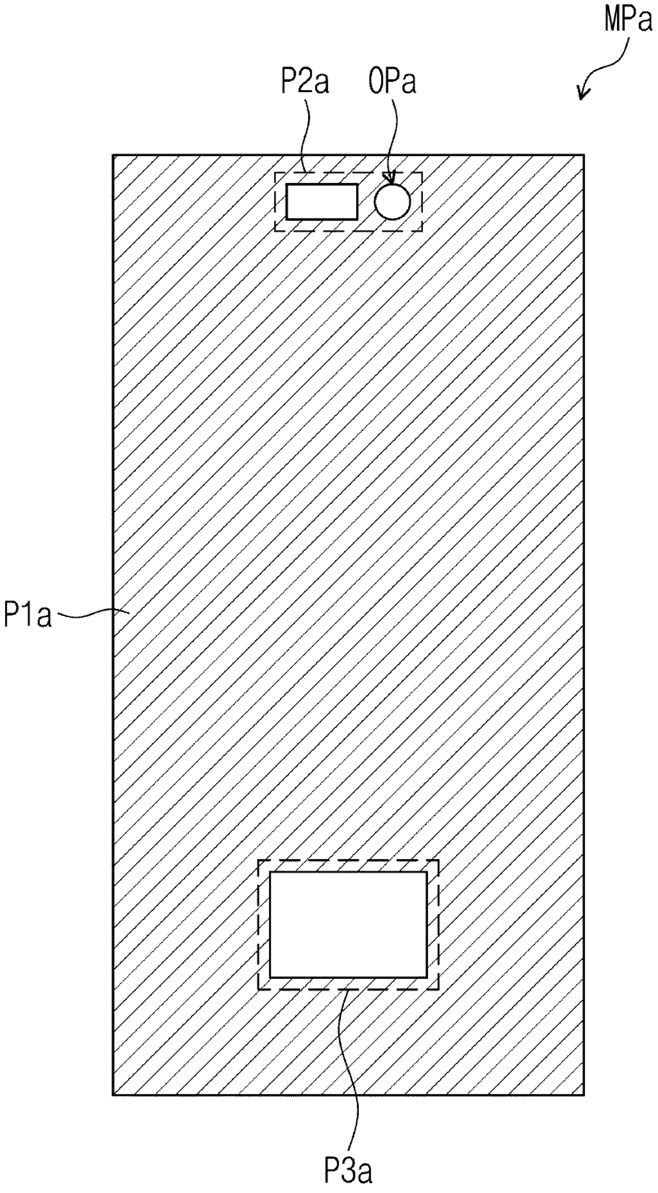
FIG. 9 is a plan view of a support plate according to an embodiment of the present disclosure.

FIG. 9 is a plan view of a support plate according to an embodiment of the present disclosure. Referring to FIGS. 8 and 9, a plurality of openings OPa may be defined in the support plate MPa. The support plate MPa may include a first area P1*a*, a second area P2*a*, and a third area P3*a*.

The first area P1*a* may be an area in which the plurality of openings OPa are not defined. The second area P2*a* may be an area in which some of the plurality of openings OPa are defined. The third area P3*a* may be an area in which the remaining ones of the plurality of openings OPa are defined. In a plan view, the first area P1*a* may correspond to an area of the active area AAa. The second area P2*a* may correspond to the first sensing area PH and the second sensing area SA. The third area P3*a* may correspond to the third sensing area 1000DA.

The first area P1*a* may have first heat dissipation characteristics. The first heat dissipation characteristics may be defined by components of the electronic device EAa which overlap the first area P1*a*.

The second area P2*a* may have second heat dissipation characteristics. The second heat dissipation characteristics may be different from the first heat dissipation characteristics due to the camera module CAM, the first electronic module EM1, and the second electronic module EM2 disposed under the support plate.

The third area P3*a* may have third heat dissipation characteristics. The third heat dissipation characteristic may be different from the first heat dissipation characteristic by the input sensor IS disposed under the support plate.

For example, in the case of some panels, a camera may be used to photograph a subject through the panel on the rear surface. Alternatively, a fingerprint sensor may be disposed on the back of the panel, and fingerprint recognition may be performed on the front surface of the panel. Because the corresponding area is an opening and there is no support plate MPa on the rear surface, its heat dissipation capacity may be lower than that of other areas. Depending on the design of the product, two or more areas with different heat dissipation characteristics may exist on the rear surface of the display panel DP.

Figure 10:
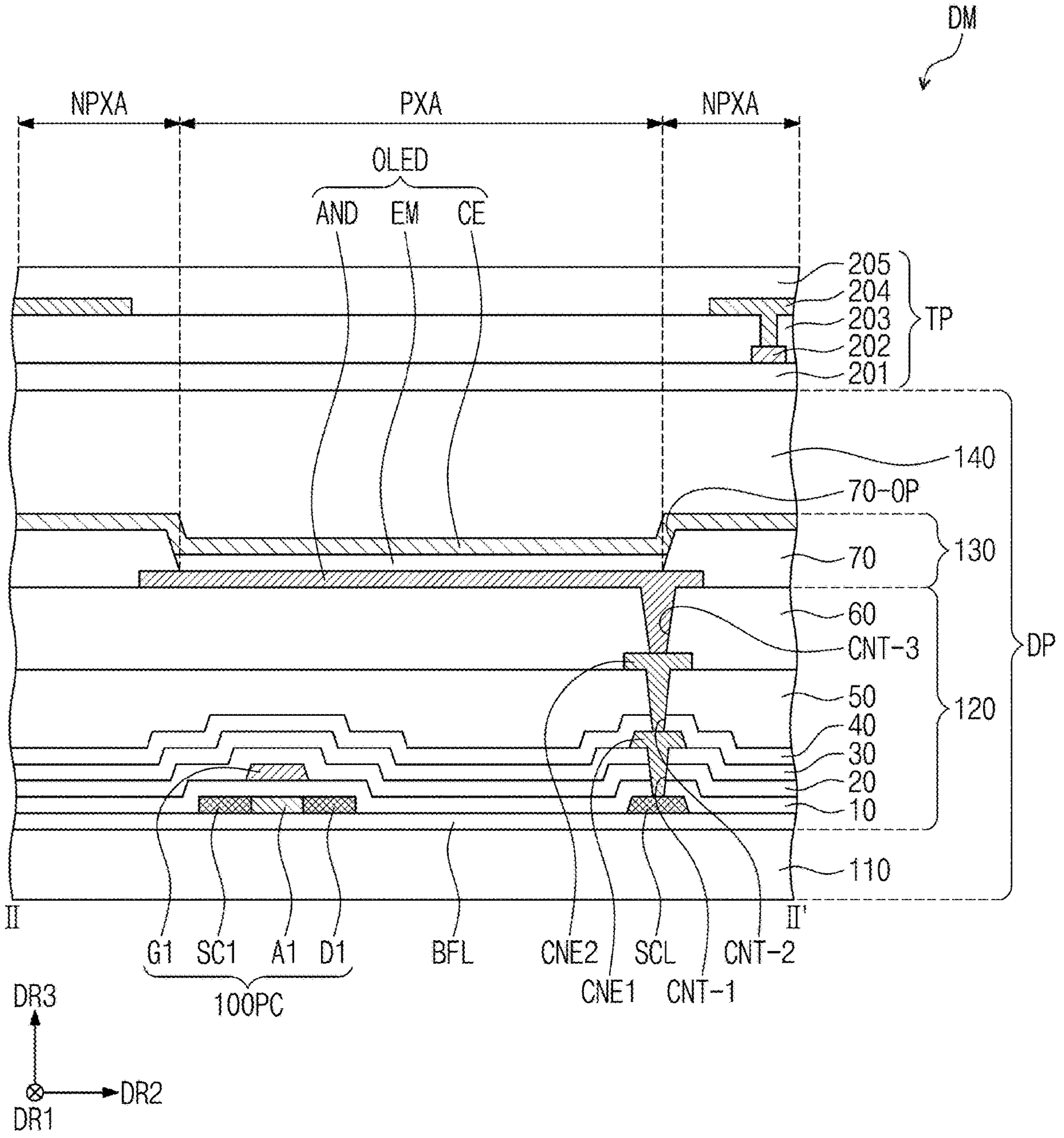
FIG. 10 is a cross-sectional view of an electronic device taken along line I-I' of FIG. 1 according to an embodiment of the present disclosure.

FIG. 10 is a cross-sectional view of a display module taken along line II-II' of FIG. 4 according to an embodiment of the present disclosure. Referring to FIG. 10, the display module DM may include a display panel DP and an input sensing part TP that is disposed on the display panel DP. The display panel DP may include a base layer 110, a circuit layer 120, a light emitting element layer 130, and an encapsulation layer 140.

At least one inorganic layer may be formed on an upper surface of the base layer 110. The inorganic layer may include at least one of aluminum oxide, titanium oxide, silicon oxide, silicon oxynitride, zirconium oxide, and hafnium oxide. The inorganic layer may be formed of multiple layers. The multiple inorganic layers may constitute a barrier layer and/or a buffer layer. In an embodiment, it is illustrated that the display panel DP includes a buffer layer BFL.

The buffer layer BFL may improve a bonding force between the base layer 110 and a semiconductor pattern. The buffer layer BFL may include a silicon oxide layer and a silicon nitride layer. The silicon oxide layer and the silicon nitride layer may be laminated alternately.

The semiconductor pattern may be disposed on the buffer layer BFL. The semiconductor pattern may include polysilicon. However, an embodiment is not limited thereto, and the semiconductor pattern may include amorphous silicon, low-temperature polycrystalline silicon, or an oxide semiconductor.

FIG. 10 only illustrates a portion of the semiconductor pattern, and the semiconductor pattern may be further disposed in another area. The semiconductor patterns may be arranged across pixels in a specific configuration. Electrical characteristics of the semiconductor pattern may be different depending on whether the semiconductor pattern is doped. The semiconductor pattern may include a first area having high conductivity and a second area having low conductivity. The first area may be doped with an N-type dopant or a P-type dopant. The P-type transistor may include the doped area doped with a P-type dopant, and the N-type transistor may include the doped area doped with an N-type dopant. The second area may be an undoped area or may be doped with a lower concentration than the first area.

The conductivity of the first area is greater than that of the second area. The first area may substantially operate as an electrode or signal line. The second area may substantially correspond to an active (or a channel) of a transistor. In other words, a part of the semiconductor pattern may be an active of the transistor. Another part thereof may be a source or drain of the transistor. Another part may be a connection electrode or a connection signal line.

Each of the pixels may have an equivalent circuit including seven transistors, one capacitor, and a light emitting element, and the equivalent circuit of a pixel may be modified in various shapes. For example, each of the pixels may include eight transistors, one capacitor, and a light emitting element. The pixels will be described later. One transistor 100PC and one light emitting element OLED included in a pixel are illustrated in FIG. 10 by way of example.

The transistor 100PC may include a source SC1, an active A1, a drain D1, and a gate G1. The source SC1, the active A1, and the drain D1 may be formed from the semiconductor pattern. The source SC1 and the drain D1 may extend in directions opposite to each other from the active A1 in a cross sectional view. A part of a connection signal line SCL formed from the semiconductor pattern is illustrated in FIG.

10. Although not illustrated separately, the connection signal line SCL may be electrically connected to the drain D1 of the transistor 100PC on a plane.

A first insulating layer 10 may be disposed on the buffer layer BFL. The first insulating layer 10 may overlap a plurality of pixels in common and may cover the semiconductor pattern. The first insulating layer 10 may be an inorganic layer and/or an organic layer, and may have a single layer or multi-layer structure. The first insulating layer 10 may include at least one of an aluminum oxide, a titanium oxide, a silicon oxide, a silicon nitride, a silicon oxynitride, a zirconium oxide, and a hafnium oxide. In an embodiment, the first insulating layer 10 may be a single silicon oxide layer. Not only the first insulating layer 10 but also an insulating layer of the circuit layer 120 that will be described later may be an inorganic layer and/or an organic layer, and may have a single layer or multi-layer structure. The inorganic layer may include at least one of the above-described materials, but the present disclosure is not limited thereto.

The gate G1 is disposed on the first insulating layer 10. The gate G1 may be a portion of a metal pattern. The gate G1 overlaps the active A1. In a process of doping the semiconductor pattern, the gate G1 may function as a self-aligned mask.

A second insulating layer 20 is disposed on the first insulating layer 10, and may cover the gate G1. The second insulating layer 20 may overlap the pixels in common. The second insulating layer 20 may be an inorganic layer and/or an organic layer, and may have a single layer or multi-layer structure. The second insulating layer 20 may include at least one of silicon oxide, silicon nitride, and silicon oxynitride. In an embodiment, the second insulating layer 20 may have a multi-layer structure including a silicon oxide layer and a silicon nitride layer.

A third insulating layer 30 may be disposed on the second insulating layer 20. The third insulating layer 30 may have a single layer or multi-layer structure. For example, the third insulating layer 30 may have a multi-layer structure including a silicon oxide layer and a silicon nitride layer.

A first connection electrode CNE1 may be disposed on the third insulating layer 30. The first connection electrode CNE1 may be connected to the connection signal line SCL through a contact hole CNT-1 penetrating the first, second, and third insulating layers 10, 20, and 30.

A fourth insulating layer 40 may be disposed on the third insulating layer 30. The fourth insulating layer 40 may be a single-layered silicon oxide layer. A fifth insulating layer 50 may be disposed on the fourth insulating layer 40. The fifth insulating layer 50 may be an organic layer.

A second connection electrode CNE2 may be disposed on the fifth insulating layer 50. The second connection electrode CNE2 may be connected to the first connection electrode CNE1 through a contact hole CNT-2 passing through the fourth insulating layer 40 and the fifth insulating layer 50.

A sixth insulating layer 60 may be disposed on the fifth insulating layer 50, and may cover the second connection electrode CNE2. The sixth insulating layer 60 may be an organic layer.

The light emitting element layer 130 may be disposed on the circuit layer 120. The light emitting element layer 130 may include a light emitting element OLED. For example, the light emitting element layer 130 may include an organic light emitting material, a quantum dot, a quantum rod, a micro-LED, or a nano-LED. Hereinafter, an example of the light emitting element OLED being an organic light emitting element will be described, but the present disclosure is not particularly limited thereto.

The light emitting element OLED may include a first electrode AND, an emission layer EM, and a second electrode CE. The first electrode AND may be disposed on the sixth insulating layer 60. The first electrode AND may be connected to the second connection electrode CNE2 through a contact hole CNT-3 penetrating the sixth insulating layer 60.

A pixel definition film 70 may be disposed on the sixth insulating layer 60 and may cover a portion of the first electrode AND. An opening 70-OP is defined in the pixel definition film 70. The opening 70-OP of the pixel definition film 70 exposes at least part of the first electrode AND.

The active area F-AA (see FIG. 1) may include an emission area PXA and a non-emission area NPXA adjacent to the emission area PXA. The non-emission area NPXA may surround the emission area PXA. In an embodiment, the emission area PXA is defined to correspond to a partial area of the first electrode AND exposed by the opening 70-OP.

The emission layer EM may be disposed on the first electrode AND. The emission layer EM may be disposed in an area corresponding to the opening 70-OP. That is, the emission layer EM may be separately formed on each of pixels. When the emission layers EM are separately formed in each of pixels, each of the emission layers EM may emit light of at least one of a blue color, a red color, and a green color. However, an embodiment is not limited thereto. For example, the emission layer EM may be connected and provided to each of the pixels in common. In this case, the emission layer EM may provide blue light or white light.

The second electrode CE may be disposed on the emission layer EM. The second electrode CE may be disposed in a plurality of pixels in common while having an integral shape. The second electrode CE may be referred to as the common electrode CE.

Although not illustrated, a hole control layer may be interposed between the first electrode AND and the emission layer EM. The hole control layer may be disposed in common in the emission area PXA and the non-emission area NPXA. The hole control layer may include a hole transport layer, and may further include a hole injection layer. An electron control layer may be interposed between the emission layer EM and the second electrode CE. The electron control layer may include an electron transport layer, and may further include an electron injection layer. The hole control layer and the electron control layer may be formed in common in a plurality of pixels by using an open mask.

An encapsulation layer 140 may be disposed on the light emitting element layer 130. The encapsulation layer 140 may include an inorganic layer, an organic layer, and an inorganic layer that are sequentially laminated, and layers that constitute the encapsulation layer 140 are not limited thereto.

The inorganic layers may protect the light emitting element layer 130 from moisture and oxygen, and the organic layer may protect the light emitting element layer 130 from a foreign material such as dust particles. The inorganic layers may include a silicon nitride layer, a silicon oxynitride layer, a silicon oxide layer, a titanium oxide layer, an aluminum oxide layer, or the like. The organic layer may include an acrylate-based organic layer, but is not limited thereto.

The input sensing part TP may be formed on the display panel DP through sequential processes. In this case, it may be expressed that the input sensing part TP is directly disposed on the display panel DP. The expression “being directly disposed” may mean that a third component is not interposed between the input sensing part TP and the display panel DP. That is, a separate adhesive member may not be interposed between the input sensing part TP and the display panel DP. Alternatively, the input sensing part TP may be coupled to the display panel DP through an adhesive member. The adhesive member may include a typical adhesive or a sticking agent.

The input sensing part TP may include a base insulating layer 201, a first conductive layer 202, a sensing insulating layer 203, a second conductive layer 204, and a cover insulating layer 205.

The base insulating layer 201 may be an inorganic layer including at least one of silicon nitride, silicon oxynitride, and silicon oxide. Alternatively, the base insulating layer 201 may be an organic layer including an epoxy resin, an acrylate resin, or an imide-based resin. The base insulating layer 201 may have a single layer structure or may have a multi-layer structure that is laminated in the third direction DR3.

Each of the first conductive layer 202 and the second conductive layer 204 may have a single layer structure, or may have a multi-layer structure in which layers are laminated in the third direction DR3.

A conductive layer of a single layer structure may include a metal layer or a transparent conductive layer. The metal layer may include molybdenum, silver, titanium, copper, aluminum, or an alloy thereof. The transparent conductive layer may include a transparent conductive oxide, such as indium tin oxide (ITO), indium zinc oxide (IZO), zinc oxide (ZnO), indium zinc tin oxide (IZTO), or the like. Besides, the transparent conductive layer may include a conductive polymer such as PEDOT, a metal nano wire, graphene, and the like.

A conductive layer of the multi-layer structure may include metal layers. For example, the metal layers may have a three-layer structure of titanium/aluminum/titanium. The conductive layer of the multi-layer structure may include at least one metal layer and at least one transparent conductive layer.

At least one of the sensing insulating layer 203 and the cover insulating layer 205 may include an inorganic film. The inorganic film may include at least one of aluminum oxide, titanium oxide, silicon oxide, silicon nitride, silicon oxynitride, zirconium oxide, and hafnium oxide.

At least one of the sensing insulating layer 203 and the cover insulating layer 205 may include an organic film. The organic film may include at least one of acrylate-based resin, methacrylate-based resin, polyisoprene, vinyl-based resin, epoxy-based resin, urethane-based resin, cellulose-based resin, siloxane-based resin, polyimide-based resin, polyamide-based resin, and perylene-based resin.

Figure 11:
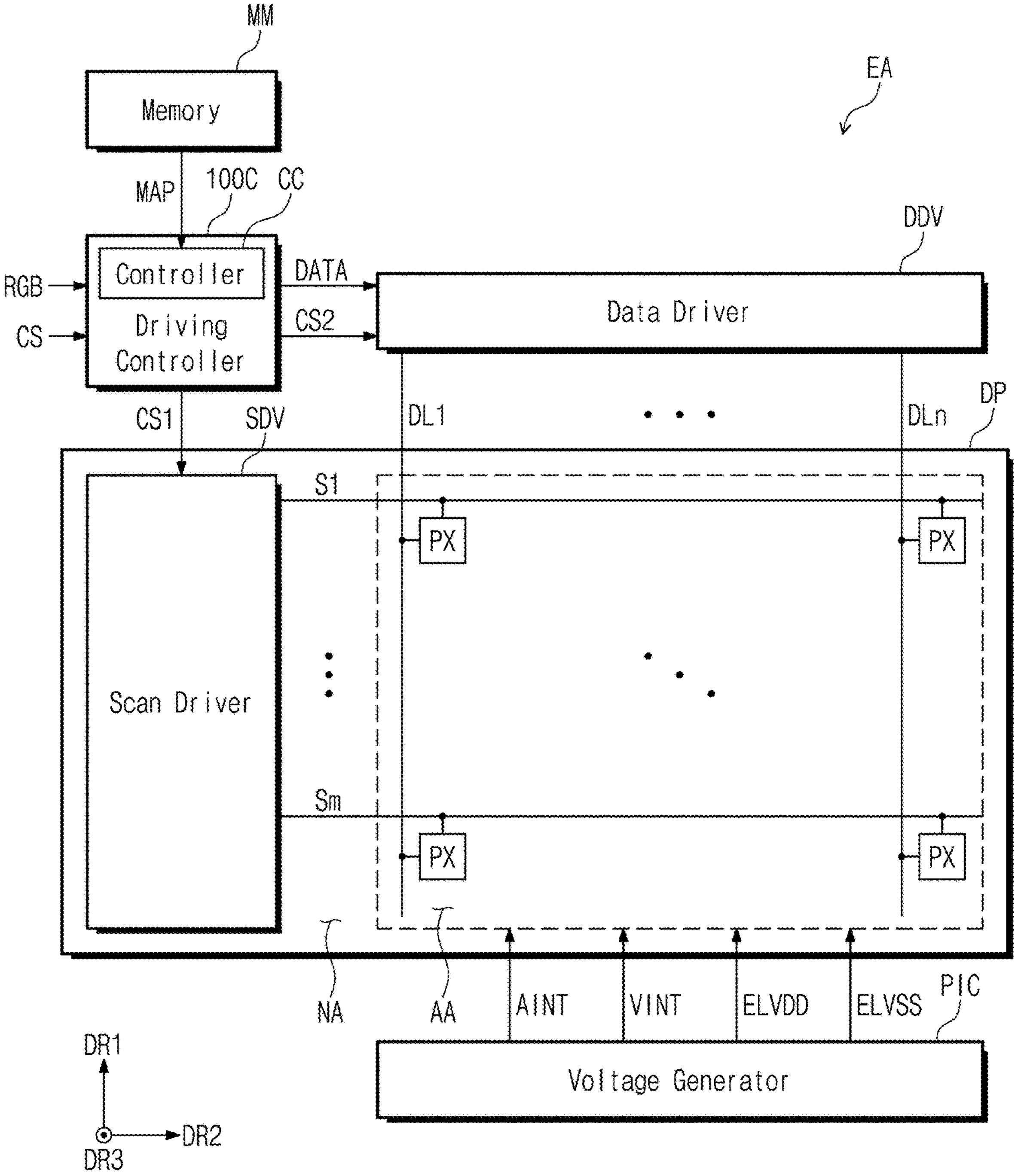
FIG. 11 is a block diagram of an electronic device according to an embodiment of the present disclosure.

FIG. 11 is a block diagram of an electronic device according to an embodiment of the present disclosure. Referring to FIG. 11, the electronic device EA may include a display panel DP, a voltage generator PIC, a scan driver SDV, a data driver DDV, a driving controller 100C, and a memory MM.

An active area AA and a peripheral area NA adjacent to the active area AA may be defined in the display panel DP.

The active area AA may correspond to a display area DM-DA (see FIG. 4) of a display module DM (see FIG. 4), and the peripheral area NA may correspond to a non-display area DM-NDA (see FIG. 4) of the display module DM (see FIG. 4).

The display panel DP may include a plurality of pixels PX, a plurality of scan lines S1 to Sm, and a plurality of data lines DL1 to DLn. Each of ‘m’ and ‘n’ is a natural number.

The plurality of scan lines S1 to Sm may be connected to the plurality of pixels PX and the scan driver SDV. Each of the plurality of scan lines S1 to Sm may extend in the second direction DR2. The plurality of scan lines S1 to Sm may be spaced apart from each other in the first direction DR1.

The plurality of data lines DL1 to DLn may be connected to the plurality of pixels PX and the data driver DDV. Each of the plurality of data lines DL1 to DLn may extend in the first direction DR1. The plurality of data lines DL1 to DLn may be spaced apart from each other in the first direction DR1.

The voltage generator PIC may generate and control power and/or common power provided to the display panel DP. The voltage generator PIC may generate and control a first driving voltage ELVDD, a second driving voltage ELVSS, a first initialization voltage VINT, and a second initialization voltage AINT.

A first driving voltage ELVDD, a second driving voltage ELVSS, and an initialization voltage Vinit may be applied to the display panel DP. A voltage level of the second driving voltage ELVSS may be lower than a voltage level of the first driving voltage ELVDD. The first driving voltage ELVDD, the second driving voltage ELVSS, and the initialization voltage Vinit may be applied to the plurality of pixels PX.

The driving controller 100C may receive an image signal RGB and a control signal CS from the outside (e.g., a system board). The driving controller 100C may generate image data DATA by converting a data format of the image signal RGB so as to be suitable for the data driver DDV and interface specifications. The driving controller 100C may provide the data driver DDV with the image data DATA whose data format is converted.

The driving controller 100C may generate and output a first control signal CS1 and a second control signal CS2 in response to the control signal CS provided from the outside. The first control signal CS1 may be defined as a scan control signal. The second control signal CS2 may be defined as a data control signal. The first control signal CS1 may be provided to the scan driver SDV. The second control signal CS2 may be provided to the data driver DDV.

The driving controller 100C may include a controller CC. The controller CC may calculate heat generation characteristics of the display panel DP. This will be described later.

The scan driver SDV may generate a plurality of scan signals in response to the first control signal CS1. The plurality of scan signals may be applied to the plurality of pixels PX through the plurality of scan lines S1 to Sm. The scan driver SDV may be disposed in a peripheral area NA.

The display panel DP according to an embodiment of the present disclosure may further include a light emitting driving circuit (not shown). The light emitting driving circuit may output emission control signals to the display panel DP in response to an emission driving control signal from the driving controller 100C.

The data driver DDV may generate a plurality of data voltages corresponding to the image data DATA in response to the second control signal CS2. The plurality of data voltages may be applied to the plurality of pixels PX through the data lines DL1 to DLn. The data driver DDV may simultaneously provide the data lines DL1 to DLn with the data voltages generated in units of pixel row in the plurality of pixels PX.

The plurality of pixels PX may be arranged in the active area AA. The plurality of pixels PX may receive the plurality of data voltages in response to the plurality of scan signals. The plurality of pixels PX may display images by emitting light of luminance corresponding to the plurality of data voltages. The plurality of pixels PX may simultaneously emit light to display the image.

The memory MM may be connected to the controller CC of the driving controller 100C. A plurality of maps MAP may be stored in the memory MM. The memory MM may provide the plurality of maps MAP to the controller CC. The plurality of maps MAP will be described later.

Figure 12:
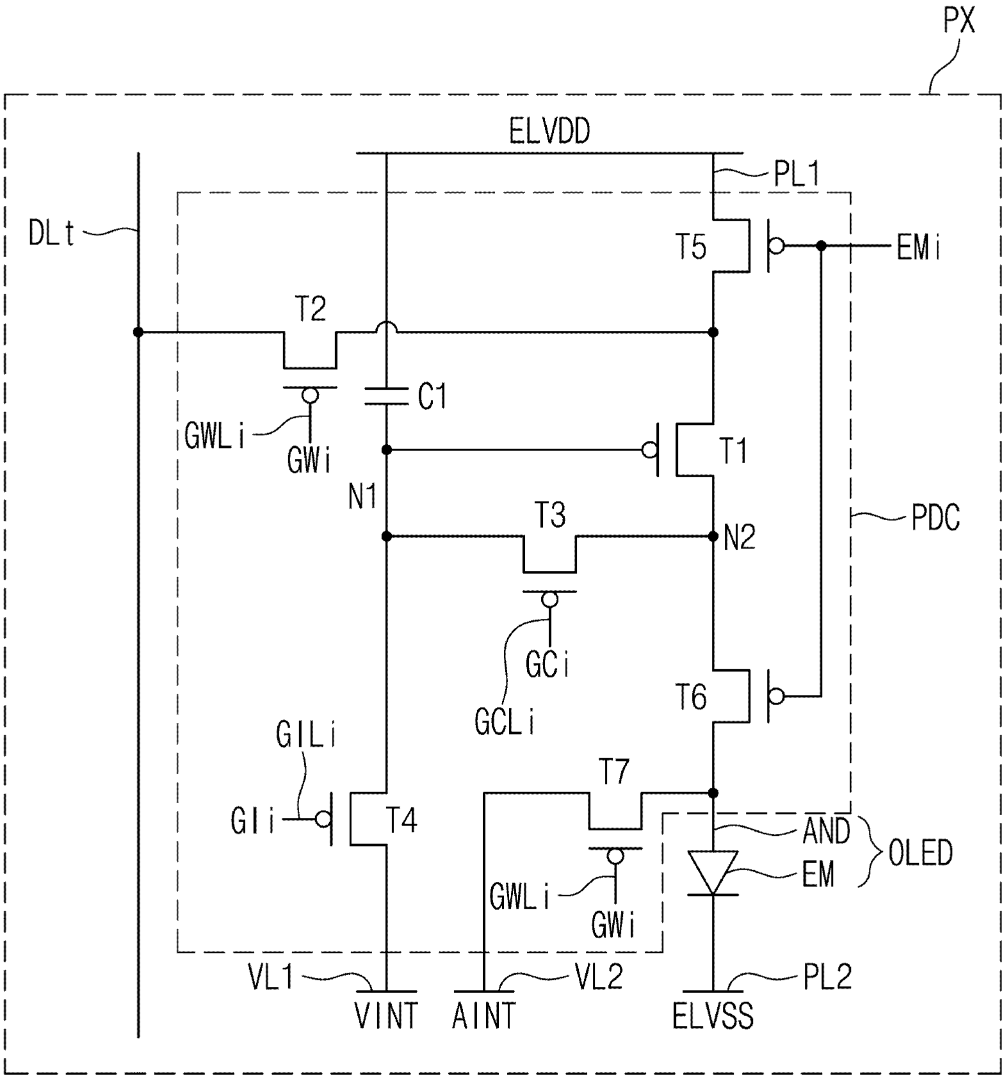
FIG. 12 is an equivalent circuit diagram of a pixel according to an embodiment of the present disclosure.

FIG. 12 is an equivalent circuit diagram of a pixel according to an embodiment of the present disclosure. FIG. 12 shows an equivalent circuit diagram of one of the plurality of pixels PX of FIG. 11.

Referring to FIGS. 11 and 12, a pixel PX may include a pixel driving circuit PDC and the light emitting element OLED.

The plurality of scan lines S1 to Sm may include a plurality of first scan lines, a plurality of second scan lines, a plurality of third scan lines, and a plurality of emission control lines.

A pixel PX may be connected to a t-th data line DLt among the data lines DL1 to DLn, an i-th first scan line GWi among a plurality of first scan lines, an i-th second scan line GCi among a plurality of second scan lines, an i-th third scan line GIi among a plurality of third scan lines, and an i-th emission control line EMLi among a plurality of emission control lines.

The light emitting element OLED may operate in an on state or an off state. The light emitting element OLED may include a first electrode AND, an emission layer EM, and a second electrode. The first electrode AND may be referred to as an anode AND. The second electrode may be referred to as a cathode. The second electrode is provided in common, and may be referred to as a second electrode CE (see FIG. 10).

The pixel driver PDC may include a first transistor T1, a second transistor T2, a third transistor T3, a fourth transistor T4, a fifth transistor T5, a sixth transistor T6, a seventh transistor T7, and a capacitor C1.

In an embodiment of the present disclosure, a pixel PX may be referred to as having a 7T1C structure.

Each of the plurality of transistors may be a P-type transistor having a low-temperature polycrystalline silicon (LTPS) semiconductor layer. However, this is exemplary, and the semiconductor layer according to an embodiment of the present disclosure is not limited thereto, and may include an oxide semiconductor, crystalline silicon, or the like. However, this is an example, and all of the plurality of transistors according to an embodiment of the present disclosure may be N-type transistors, and, in an embodiment, at least one of a plurality of transistors may be a P-type transistor and the remaining ones may be N-type transistors.

The first scan line GWLi may transmit a first scan signal GWi, a second scan line GCLi may transmit a second scan signal GCi, and a third scan line GILi may transmit a third scan signal GIi.

A first power line PL1 may provide a first driving voltage ELVDD. A second power line PL2 may provide the second driving voltage ELVSS. A voltage level of the second driving voltage ELVSS may be lower than a voltage level of the first driving voltage ELVDD. The first voltage line VL1 may provide a first initialization voltage VINT. The second voltage line VL2 may provide a second initialization voltage AINT.

The light emitting element OLED may be connected between a second power line PL2 and a sixth transistor T6. The anode AND of the light emitting element OLED may be electrically connected to the first power line PL1 via the sixth transistor T6, the first transistor T1, and the fifth transistor T5. The cathode of the light emitting element OLED may be electrically connected to the second power line PL2.

The first transistor T1 may be electrically connected between a second node N2 and the first power line PL1. The first transistor T1 may include a gate electrode connected to a first node N1, a first electrode connected to the second node N2, and a second electrode electrically connected to the first power line PL1 via a fifth transistor T5. The first transistor T1 may be referred to as a driving transistor. The first electrode of the first transistor T1 may be electrically connected to the light emitting element OLED via the sixth transistor T6.

The second transistor T2 may be connected to the data line DL. The second transistor T2 may include a gate electrode, to which a first scan signal GWi is provided, a first electrode electrically connected to the data line DL, and a second electrode connected to the second electrode of the first transistor T1. The second transistor T2 may be referred to as a switch transistor. The gate electrode of the second transistor T2 may be connected to the first scan line GWLi.

The third transistor T3 may be connected between the first node N1 and the second node N2. An i-th second scan signal GCi may be applied to the third transistor T3. The third transistor T3 may include a gate electrode, to which the second scan signal GCi is provided, a first electrode connected to the first node N1, and a second electrode connected to the second node N2. The gate electrode of the third transistor T3 may be connected to the second scan line GCLi.

The fourth transistor T4 may be connected between the first node N1 and the first voltage line VL1. An i-th third scan signal GIi may be applied to the fourth transistor T4. The fourth transistor T4 may include a gate electrode, to which the third scan signal GIi is provided, a first electrode connected to the first node N1, and a second electrode connected to the first voltage line VL1. The gate electrode of the fourth transistor T4 may be connected to the third scan line GILi.

An emission control signal EM1 may be applied to the fifth transistor T5. The fifth transistor T5 may be connected between the first power line PL1 and the first transistor T1. The fifth transistor T5 may include a gate electrode, to which the emission control signal EM1 is provided, a first electrode connected to the first power line PL1, and a second electrode connected to the first transistor T1. The gate electrode of the fifth transistor T5 may be connected to the emission control line EMLi.

An emission control signal EM1 may be applied to the sixth transistor T6. The sixth transistor T6 may be connected between a light emitting element OLED and the first transistor T1. The sixth transistor T6 may include a gate electrode, to which the emission control signal EM1 is provided, a first electrode connected to the light emitting element OLED, and a second electrode connected to the first transistor T1. The gate electrode of the sixth transistor T6 may be connected to an emission control line EMLi.

An i-th first scan signal GWi may be applied to the seventh transistor T7. The seventh transistor T7 may be connected between a light emitting element OLED and a second voltage line VL2. The seventh transistor T7 may include a gate electrode, to which the first scan signal GWi is provided, a first electrode connected to the light emitting element OLED, and a second electrode connected to the second voltage line VL2. The gate electrode of the seventh transistor T7 may be connected to the first scan line GWLi.

Figure 13:
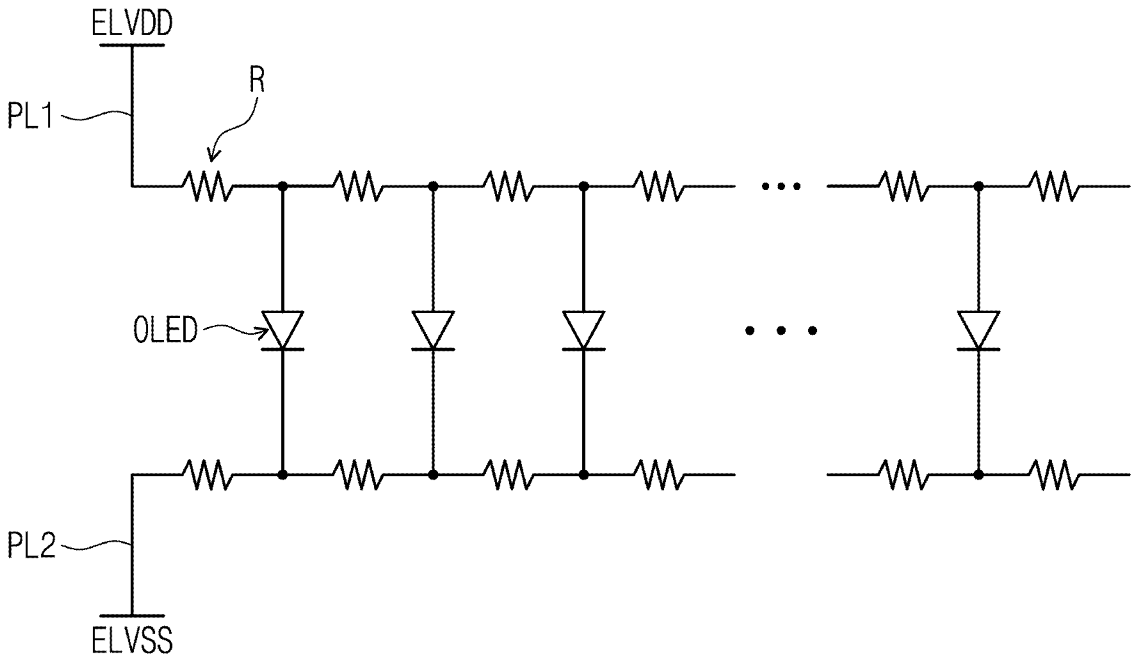
FIG. 13 schematically illustrates a plurality of light emitting elements and power lines according to an embodiment of the present disclosure.

The first capacitor C1 may be connected between the first power line PL1 and the first node N1. The first capacitor C1 may be referred to as a storage capacitor. FIG. 13 schematically illustrates a plurality of light emitting elements and power lines according to an embodiment of the present disclosure.

Referring to FIGS. 11 to 13, the voltage generator PIC may generate the first driving voltage ELVDD and the second driving voltage ELVSS. The voltage generator PIC may provide the first driving voltage ELVDD to the first power line PL1 and may provide the second driving voltage ELVSS to the second power line PL2.

The plurality of light emitting elements OLED may be connected in parallel between the first power line PL1 and the second power line PL2.

The deviation of each of the first driving voltage ELVDD and the second driving voltage ELVSS may occur for each position of the plurality of light emitting elements OLED by a resistor "R" of each of the first power line PL1 and the second power line PL2.

The plurality of maps MAP stored in the memory MM may include maps M5 and M6 (see FIG. 14) in which the first driving voltage ELVDD and/or the second driving voltage ELVSS are stored for each position of the active area AA.

The controller CC may receive the maps M5 and M6 (see FIG. 14) from the memory MM and may calculate heat generation characteristics reflecting the deviation. This will be described later.

Figure 14:
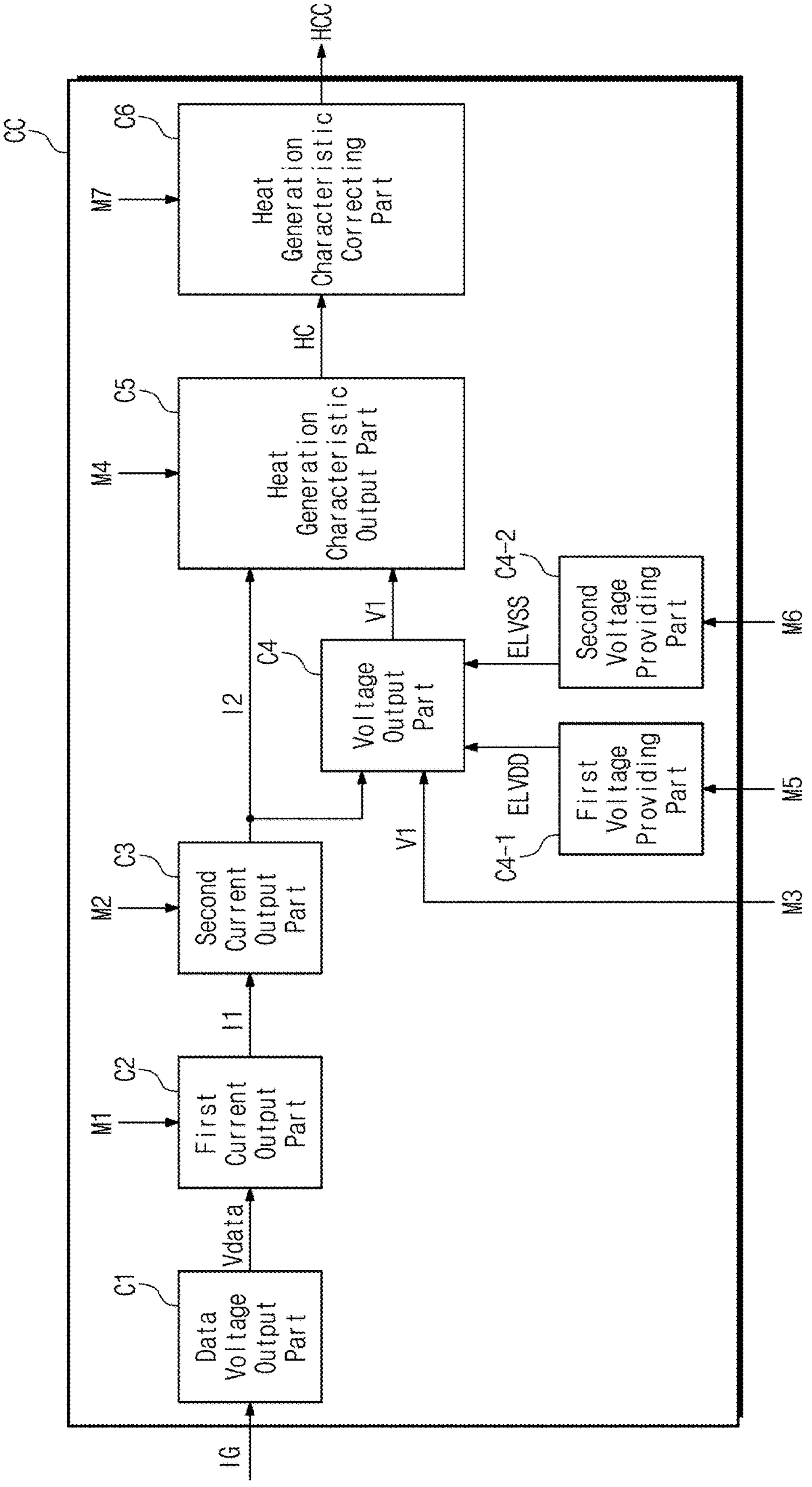
FIG. 14 is a block diagram illustrating a controller according to an embodiment of the present disclosure.
Figure 15:
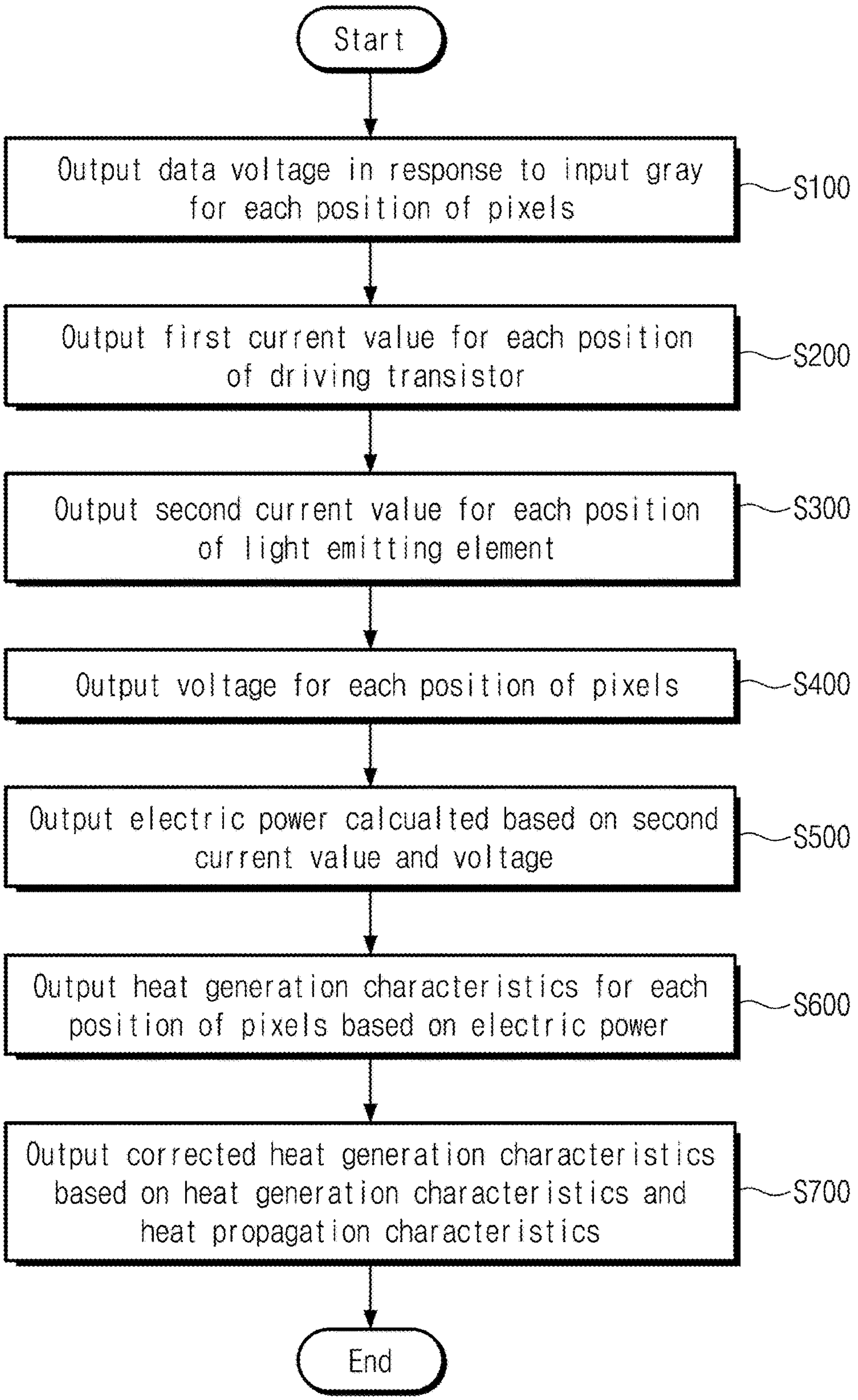
FIG. 15 is a flowchart illustrating a method for driving an electronic device according to an embodiment of the present disclosure.

FIG. 14 is a block diagram illustrating a controller according to an embodiment of the present disclosure, and FIG. 15 is a flowchart illustrating a method for driving the electronic device according to an embodiment of the present disclosure.

Referring to FIGS. 5, 11, 12, 14, and 15, the memory MM may store the plurality of maps MAP. The plurality of maps MAP may include a first map M1, a second map M2, a third map M3, a fourth map M4, a fifth map M5, a sixth map M6, and a seventh map M7.

A first current value I1 for each position within the active area AA of a driving transistor T1 according to a data voltage Vdata may be stored in the first map M1. The data voltage Vdata may be provided to a data line DL connected to a second transistor T2. The driving transistor T1 may be referred to as a first transistor T1.

A second current value I2 for each position of the light emitting element OLED according to the first current value I1 may be stored in the second map M2.

A voltage V1 for each position within the active area AA applied to each of the plurality of pixels PX may be stored in the third map M3.

Power calculated based on a current and a voltage V1 applied to each of the plurality of pixels PX may be stored in the fourth map M4.

The first driving voltage ELVDD for each position of the active area AA may be stored in the fifth map M5.

The second driving voltage ELVSS for each position of the active area AA may be stored in the sixth map M6.

The seventh map M7 may store heat propagation characteristics of the support plate MP according to position. For example, when the seventh map M7 stores heat propagation characteristics for each position of the support plate MP included in the electronic device EA described in FIG. 3A, the seventh map M7 may store a first value corresponding to a plurality of first areas P1, a second value corresponding to a second area P2 that is different from the first value, a third value corresponding to a plurality of third areas P3 that is different from the first value and the second value, and a fourth value corresponding to a fourth area P4 that is different from the first to third values. The first to fourth values may be the thermal resistance and the peripheral propagation coefficient for each position of the support plate MP according to position.

However, this is merely an example and the configuration of the seventh map M7 according to an embodiment of the present disclosure is not limited thereto. For example, when the seventh map M7 stores position-specific heat propagation characteristics of the support plate MPa (see FIG. 9) included in the electronic device EAa described in FIG. 7, a first value corresponding to a first area P1*a* (see FIG. 9), a second value corresponding to a second area P2*a* (see FIG. 9) that is different from the first value, and a third value corresponding to a third area P3*a* that is different from the first value and the second value may be defined in the seventh map M7. The first to third values may be the thermal resistance and the peripheral propagation coefficient for each position of the support plate MPa (see FIG. 9).

However, this is merely an example. For example, at least one of the plurality of maps MAP according to an embodiment of the present disclosure may have a look-up table format having a one-dimensional array structure instead of a map format having a 2-dimensional array structure, or a register format having a value of 'a' or 'b'. For example, because a location-specific process deviation of the first driving voltage ELVDD is not large, the format of the fifth map M5 may be stored in a lookup table format by storing the first driving voltage ELVDD for each row or column. In this case, the capacity of the memory MM required may be reduced.

The controller CC may include a data voltage output part C1, a first current output part C2, a second current output part C3, a voltage output part C4, a first voltage providing part C4-1, a second voltage providing part C4-2, and a heat generation characteristics output part C5, and a heat generation characteristics correcting part C6.

The data voltage output part C1 may receive the image signal RGB which includes the input gray IG. The data voltage output part C1 may output the data voltage Vdata corresponding to the input gray IG for each position of pixels PX (S100).

A first current output part C2 may be disposed between the data voltage output part C1 and the second current output part C3. The first current output part C2 may receive a data voltage Vdata from the data voltage output part C1. The first current output part C2 may output a first current value I1 for each position of the driving transistor T1 corresponding to the data voltage Vdata based on a first map M1 (S200).

According to the present disclosure, the influence of the difference caused by the process deviation depending on the position of the driving transistor T1 may be improved by the first current output part C2.

The second current output part C3 may be connected to the first current output part C2, the voltage output part C4, and the heat generation characteristics output part C5. The second current output part C3 may receive the first current value I1 from the first current output part C2. The second current output part C3 may output the second current value I2 for each position of a light emitting element corresponding to the first current value I1 based on the second map M2 (S300).

According to the present disclosure, the influence of the difference caused by the process deviation depending on the position of the light emitting element OLED may be improved by the second current output part C3.

A first voltage providing unit C4-1 may provide the first driving voltage ELVDD for each position of pixels PX to the voltage output part C4 based on the fifth map M5.

A second voltage providing unit C4-2 may provide the second driving voltage ELVSS for each position of pixels PX to the voltage output part C4 based on the sixth map M6.

The voltage output part C4 may be connected to the second current output part C3, the heat generation characteristics output part C5, the first voltage providing part C4-1, and the second voltage providing part C4-2. The voltage output part C4 may receive the second current value I2 from the second current output part C3. The voltage output part C4 may receive the first driving voltage ELVDD from the first voltage providing part C4-1. The voltage output part C4 may receive the second driving voltage ELVSS from the second voltage providing part C4-2.

The voltage output part C4 may output a voltage V1 for each position of pixels PX which is a location-specific voltage based on the third map M3 (S400). The voltage V1 may be a value obtained by subtracting the second driving voltage ELVSS from the first driving voltage ELVDD.

According to the present disclosure, an influence of each deviation of the first driving voltage ELVDD and the second driving voltage ELVSS generated for each position of the plurality of light emitting elements OLED due to the resistance R of each of the first power line PL1 and the second power line PL2 may be improved by the voltage output part C4.

The heat generation characteristics output part C5 may be connected to the second current output part C3, the voltage output part C4, and the heat generation characteristics correcting part C6. The heat generation characteristics output part C5 may receive the second current value I2 from the second current output part C3. The heat generation characteristics output part C5 may receive the voltage V1 from the voltage output part C4.

The heat generation characteristics output part C5 may output electric power corresponding to the second current value I2 and the voltage V1 based on the fourth map M4 (S500).

The heat generation characteristics output part C5 may output the heat generation characteristics HC for each position of the plurality of pixels PX based on the electric power (S600). The heat generation characteristics HC may be proportional to the electric power.

According to the present disclosure, the influence of differences caused by the process deviation for each position of a plurality of pixels PX may be improved by the heat generation characteristics output part C5.

The heat generation characteristics correcting part C6 may be connected to the heat generation characteristics output part C5. The heat generation characteristics correcting part C6 may receive heat generation characteristics HC for each position of a plurality of pixels PX from the heat generation characteristics output part C5.

The heat generation characteristics correcting part C6 may output corrected heat generation characteristics HCC based on the heat generation characteristics HC and heat propagation characteristics stored in the seventh map M7 (S700). The heat propagation characteristics for each position of the support plate MP defined in the seventh map M7 may include thermal resistance and peripheral propagation coefficient. The heat propagation characteristics for each position of the support plate MP defined in the seventh map M7 may be changed depending on the shape and type of the support plate MP.

The driving controller 100C may predict the final heat generation pattern of the display panel DP based on the corrected heat generation characteristics HCC. The driving controller 100C may receive an image signal RGB and generate image data DATA based on the corrected heat generation characteristics HCC.

Unlike the present disclosure, areas, in which heat generation characteristics are different depending on the support plate MP, may have different thermal resistances for temperature propagation to the surroundings, and thus the final heat generation characteristics may also differ depending on the image pattern. In this case, when image data DATA is output without considering the heat propagation characteristics of the support plate MP and the display panel DP displays the image, a luminance deviation may occur for each position in the active area AA. However, according to the present disclosure, the controller CC may calculate corrected heat generation characteristics HCC for each position of the pixels PX in the active area AA through the first to seventh maps M1, M2, M3, M4, M5, M6, and M7 stored in the memory MM. Heat generation according to the characteristics of the support plate MP may be predicted through the heat generation characteristics correcting part C6. Image data DATA may be output by considering corrected heat generation characteristics HCC, and a plurality of pixels PX may output an image IM (see FIG. 3A) based on the image data DATA. Accordingly, the electronic device EA with improved display quality may be provided.

According to the present disclosure, the presence or absence, shape, and characteristics of the support plate MP disposed on the rear surface of the display panel DP may be reflected for each position. Even when the support plate does not have the same characteristics on the rear surface of the entire display panel DP, the heat generation characteristics correcting part C6 may output corrected heat generation characteristics HCC that consider the heat generation characteristics of the support plate MP based on the seventh map M7. Furthermore, when the support plate MP has different heat dissipation characteristics at each position, the characteristics due to the temperatures of the plurality of pixels PX may vary. The driving controller 100C may predict the final heat generation pattern of the display panel DP based on the corrected heat generation characteristics HCC. Accordingly, the characteristics due to the temperature of the plurality of pixels PX may be compensated for, so that brightness deviation may be prevented or eliminated. Accordingly, the electronic device EA (see FIG. 3A) with improved display quality may be provided.

As described above, the controller may calculate heat generation characteristics for each position of the pixels in an active area through a plurality of maps stored in a memory. A driving controller may receive an image signal and then may generate image data in consideration of the heat generation characteristics. The luminance for each position of the plurality of pixels may be uniformly corrected. Accordingly, an electronic device having improved display quality and a method for driving the electronic device may be provided.

Furthermore, according to the present disclosure, the presence or absence, shape, and characteristics of the support plate disposed on the rear surface of the display panel may be reflected for each position. Even when the support plate on the rear surface of the entire display panel does not have the same characteristics, the heat generation characteristics correcting part may output corrected heat generation characteristics that considers the heat generation characteristics of the support plate based on the seventh map. The driving controller may predict the final heat generation pattern of the display panel based on the corrected heat generation characteristics. Accordingly, the characteristics due to the temperature of the plurality of pixels may be compensated for, so that luminance deviation may be prevented or eliminated. Accordingly, a display device with improved display quality may be provided.

Although an embodiment of the present disclosure has been described for illustrative purposes, those skilled in the art will appreciate that various modifications, and substitutions are possible, without departing from the scope and spirit of the present disclosure as disclosed in the accompanying claims.

Accordingly, the technical scope of the present disclosure is not limited to the detailed description of this specification, but should be defined by the claims.

What is claimed is:

1. An electronic device comprising:

a display panel including a plurality of pixels each including a driving transistor and a light emitting element electrically connected to the driving transistor, and in which an active area for displaying an image and a peripheral area adjacent to the active area are defined;

a support plate disposed under the display panel and configured to support the display panel;

a memory configured to store a plurality of maps; and a driving controller configured to drive the display panel and including a controller, wherein the plurality of maps include:

a first map in which a first current value for each position in the active area of the driving transistor in response to a data voltage is defined;

a second map in which a voltage for each position in the active area applied to each of the plurality of pixels is defined;

a third map in which electric power calculated based on a current and the voltage applied to each of the plurality of pixels is defined; and a fourth map in which heat propagation characteristics for each position of the support plate are defined, and wherein the controller includes:

a first current output part configured to output the first current value corresponding to the data voltage based on the first map;

a voltage output part configured to output the voltage based on the second map;

a heat generation characteristics output part configured to calculate the electric power based on the voltage and the current, and to output heat generation characteristics for each position in the active area based on the electric power; and a heat generation characteristics correcting part configured to output corrected heat generation characteristics based on the heat generation characteristics and the heat propagation characteristics.

2. The electronic device of claim 1, wherein the controller further includes a data voltage output part configured to output the data voltage corresponding to an input gray for each position to the first current output part.

3. The electronic device of claim 1, wherein the plurality of maps further include a fifth map in which a second current value for each position of the light emitting element corresponding to the first current value is stored, and wherein the controller further includes a second current output part configured to output the second current value to the voltage output part based on the fifth map.

4. The electronic device of claim 3, wherein the first current output part outputs the first current value to the second current output part, and wherein the heat generation characteristics output part outputs the heat generation characteristics corresponding to the second current value and the voltage based on the third map.

5. The electronic device of claim 1, wherein the heat propagation characteristics for each position of the support plate defined in the fourth map include a thermal resistance and an ambient propagation coefficient.

6. The electronic device of claim 1, wherein the heat propagation characteristics for each position of the support plate defined in the fourth map are changed depending on a shape and a type of the support plate.

7. The electronic device of claim 1, wherein the support plate includes a first area, a second area extending from the first area in a first direction, and a third area extending from the second area in the first direction, wherein the second area is folded with respect to an axis extending in a second direction crossing the first direction, and wherein a first value corresponding to the first area, and a second value corresponding to the second area and different from the first value are defined in the fourth map.

8. The electronic device of claim 1, wherein an opening is defined in the support plate, and wherein a first value corresponding to an area of the support plate and a second value corresponding to the opening and different from the first value are defined in the fourth map.

9. The electronic device of claim 1, further comprising:

a voltage generator configured to provide the display panel with a first driving voltage and a second driving voltage having a voltage level lower than that of the first driving voltage, wherein the voltage is a value obtained by subtracting the second driving voltage from the first driving voltage.

10. The electronic device of claim 9, wherein the plurality of maps further includes a sixth map in which the first driving voltage is stored for each position of the active area and a seventh map in which the second driving voltage for each position is stored, and wherein the controller further includes:

a first voltage providing part configured to provide the first driving voltage to the voltage output part based on the sixth map; and a second voltage providing part configured to provide the second driving voltage to the voltage output part based on the seventh map.

11. The electronic device of claim 1, wherein the plurality of pixels are connected to a plurality of data lines and a plurality of scan lines, respectively, wherein the electronic device further includes a data driver configured to drive the plurality of data lines and a scan driver configured to drive the plurality of scan lines, and wherein the controller controls the data driver and the scan driver.

12. The electronic device of claim 1, wherein the driving controller receives an image signal and generates image data based on the corrected heat generation characteristics.

13. A method for driving an electronic device including a display panel including a plurality of pixels each including a driving transistor and a light emitting element electrically connected to the driving transistor, and a support plate disposed under the display panel, the method comprising:

outputting a data voltage in response to an input gray for each position of the plurality of pixels;

outputting a first current value for each position of the driving transistor in response to the data voltage;

outputting a voltage for each position of the plurality of pixels to a voltage output part;

outputting a heat generation characteristic for each position of the plurality of pixels based on an electric power calculated based on a current for each position of light emitting elements and the voltage; and outputting corrected heat generation characteristics based on the heat generation characteristics and heat propagation characteristics for each position of the support plate.

14. The method of claim 13, further comprising:

outputting a second current value for each position of the light emitting element in response to the first current value.

15. The method of claim 14, wherein the outputting of the second current value is disposed between the outputting of the first current value and the outputting of the voltage for each position.

16. The method of claim 14, wherein the outputting of the heat generation characteristic for each position includes calculating the electric power based on the second current value and the voltage.

17. The method of claim 14, wherein a first driving voltage and a second driving voltage having a voltage level lower than that of the first driving voltage is provided to the plurality of pixels, and wherein the outputting of the voltage includes:

outputting the first driving voltage for each position of the plurality of pixels; and outputting the second driving voltage for each position of the plurality of pixels.

18. The method of claim 17, wherein the voltage is a value obtained by subtracting the second driving voltage from the first driving voltage.

19. The method of claim 13, wherein the outputting of the corrected heat generation characteristics includes predicting a final heat generation pattern of the display panel.

20. The method of claim 13, further comprising:

receiving an image signal and generating image data based on the corrected heat generation characteristics.

* * * * *